(12) United States Patent
Savtchenko

(10) Patent No.: US 10,529,506 B2
(45) Date of Patent: Jan. 7, 2020

(54) ELECTRONIC APPARATUS COMPRISING A LINEAR KEYPAD

(71) Applicant: Serguei Konstantinovitch Savtchenko, Eindhoven (NL)

(72) Inventor: Serguei Konstantinovitch Savtchenko, Eindhoven (NL)

(73) Assignee: OneSpan North America Inc., Chicago, IL (US)

( * ) Notice: Subject to any disclaimer, the term of this patent is extended or adjusted under 35 U.S.C. 154(b) by 319 days.

(21) Appl. No.: 15/397,242

(22) Filed: Jan. 3, 2017

(65) Prior Publication Data

US 2017/0213667 A1 Jul. 27, 2017

Related U.S. Application Data

(60) Provisional application No. 62/273,550, filed on Dec. 31, 2015.

(51) Int. Cl.
*H01H 13/70* (2006.01)
*G06F 3/02* (2006.01)
*H03M 11/24* (2006.01)

(52) U.S. Cl.
CPC ........... *H01H 13/70* (2013.01); *G06F 3/0202* (2013.01); *H03M 11/24* (2013.01)

(58) Field of Classification Search
CPC .................................................. H01H 13/70
See application file for complete search history.

(56) References Cited

U.S. PATENT DOCUMENTS

| | | | |
|---|---|---|---|
| 4,211,915 A | 7/1980 | Miller et al. | |
| 5,619,196 A | 4/1997 | Escobosa | |
| 6,577,250 B1 | 6/2003 | Yee | |
| 2004/0114222 A1 | 6/2004 | Katsumata | |
| 2005/0068303 A1 | 3/2005 | Ho et al. | |
| 2014/0240296 A1 | 8/2014 | Kim et al. | |
| 2014/0285369 A1* | 9/2014 | Dempsey | H03M 1/68 341/144 |

FOREIGN PATENT DOCUMENTS

| | | |
|---|---|---|
| WO | 99/62180 | 12/1999 |
| WO | 00/30263 | 5/2000 |

* cited by examiner

*Primary Examiner* — John W Poos
(74) *Attorney, Agent, or Firm* — O'Rourke Law Office, LLC

(57) ABSTRACT

An electronic circuit providing a linear keypad and an apparatus comprising such electronic circuit are provided. Methods for detecting that a button of a linear keypad is being pressed and for determining which button is being pressed are also provided. A method for calibrating an apparatus comprising a linear keypad to enable the subsequent determination by the apparatus of which button of the linear keypad is being pressed is also provided.

42 Claims, 6 Drawing Sheets

ELECTRONIC APPARATUS COMPRISING A LINEAR KEYPAD

The invention relates to keyboards for electronic devices and electronic devices comprising keyboards.

BACKGROUND OF THE INVENTION

The usage of electronic devices requiring input by users is steadily increasing. An important number of these electronic devices rely on a keyboard or keypad for allowing a user to provide input to the device. For some of these devices the cost factor is very important. As a result, also the cost of the keyboards comprised in these devices may be important.

What is needed is a cheap and simple keypad that can be used in low-cost electronic devices for allowing users to provide input to these electronic devices.

Disclosure of the Invention

One solution for providing a keypad for an electronic apparatus is a matrix-based keypad. In a matrix-based keypad a number of buttons are arranged in R rows and C columns (wherein R and C denote positive integer numbers). Such a keypad allows for a maximum of N=R×C buttons. An electronic component for detecting which key has been pressed, e.g., a data processor of an electronic apparatus comprising the keypad, must have a minimum of R+C pins to connect to all columns and all rows of the keypad. For price critical applications it may be advantageous to be able to use a microcontroller with as few as possible required general purpose I/O pins.

The invention is based on an insight of the inventors that for many microcontrollers many of the I/O pins can be dynamically configured and reconfigured to be a digital input pin or an output pin or analog-to-digital convertor pin depending on the (dynamic) needs.

The invention is furthermore based on the insight that processors with a certain pin count can be significantly more expensive than other processors with similar capabilities but with a lower pin count and that a significant cost reduction can be attained if it is possible to use a processor with a lower pin count.

One aspect of the invention provides an electronic circuit for providing a keypad whereby the electronic component for detecting which key has been pressed only requires three pins regardless of the total number of buttons comprised in the keypad.

In some embodiments the electronic circuit comprises N switches, N−1 resistors, whereby N is an integer number larger than 1, and three terminals which in the remainder of this description will be referred to as the UP-terminal (or simply UP), the DOWN-terminal (or simply DOWN) and the ADC-terminal (or simply ADC).

In some embodiments the N switches may be comprised in or may be activated by an equal number of buttons, one button for each switch, whereby a switch may be closed if the corresponding button is pressed and the switch may be open if the corresponding button is not pressed.

The N−1 resistors may be connected in series, i.e., each terminal of each resistor is connected to exactly one terminal of exactly one other resistor, except for a first terminal of the first resistor of the series which is connected to the UP-terminal of the circuit and a last terminal of the last resistor of the series which is connected to the DOWN-terminal. Each terminal of each resistor is also connected to exactly one terminal of exactly one of the N switches of the circuit.

One terminal of a first switch of the circuit is connected to the UP-terminal, so that it is also connected to the first terminal of the first resistor of the series, and the other terminal of that first switch is connected to the ADC-terminal. One terminal of a last switch of the circuit is connected to the DOWN-terminal, so that it is also connected to the last terminal of the last resistor of the series, and the other terminal of that last switch is connected to the ADC-terminal. One terminal of each switch of all the other switches of the N switches of the circuit is connected to a node of the circuit to which two consecutive resistors of the series are connected, and the other terminal of each of these switches is connected to the ADC-terminal. The nodes of the circuit that correspond to a terminal of at least one of the N−1 resistors connected in series may be referred to as the resistor nodes. A resistor node that is connected to two different resistors of the series of N−1 resistors may be referred to as an intermediate resistor node. A resistor node that is connected to only one resistor of the series of N−1 resistors may be referred to as an end resistor node. In some embodiments one terminal of each of the N switches is connected to a resistor node. In some embodiments one terminal of each different one of the N switches is connected to a corresponding resistor node and the other terminal is connected to the ADC-terminal, such that any two different switches are connected to different corresponding resistor nodes.

In some embodiments the circuit may furthermore comprise a capacitor, one terminal of which may be connected to the ADC-terminal and the other terminal may be connected to either the ground voltage or the supply voltage of the circuit. The presence of the capacitor may help to suppress high frequency noise.

In some embodiments the circuit may furthermore comprise an electronic component, for example a digital component such as a data processor or microcontroller, which may comprise or may consist of an integrated circuit (IC) component and which may be referred to in the remainder of the description as the IC component. This electronic component may comprise minimally three different pins, a first one of which is connected to the UP-terminal, a second one of which is connected to the DOWN-terminal and a third one of which is connected to the ADC-terminal. In the remainder of the description the first pin (connected to the UP-terminal) may be referred to as the UP-pin, the second pin (connected to the DOWN-terminal) may be referred to as the DOWN-pin and the third pin (connected to the ADC-terminal) may be referred to as the ADC-pin. In some embodiments the IC component may comprise a single integrated circuit. In some embodiments the IC component may comprise a single integrated circuit package. In some embodiments the IC component may comprise two or more integrated circuits in one or more packages.

In some embodiments a pulldown (or pullup) resistor is enabled on the ADC terminal. This pulldown (or pullup) resistor may be further referred to as the ADC-resistor. In some embodiments this ADC pulldown or pullup resistor may be comprised in the IC component. In some embodiments the ADC-resistor is configured to pull the voltage at the ADC terminal to the voltage that the ADC terminal has at the ADC-pin of the IC component when the IC component is in wait state and the ADC-pin is configured as an output pin (see further). For example, the ADC-resistor may be a pulldown resistor if the ADC-pin is configured in the wait state as an output set to low.

Multiple-Button Press Protection

In some embodiments the circuit may comprise an extra resistor between the UP-pin and the series of N−1 resistors and/or between the series of N−1 resistors and the DOWN-pin. That is, in some embodiments the UP-pin may be connected to the UP-terminal of the series of N−1 resistors through an extra resistor and/or the DOWN-pin may be connected to the DOWN-terminal of the series of N−1 resistors through an extra resistor. This may avoid the risk of short-circuit when the IC component is in active state (see further) in case both the first and last button are being pressed simultaneously.

Dimensioning

The current through the series of resistors should preferably not be too high (the output pins have a certain limit) and it should not be too low either (e.g., to minimize the sensitivity to electro-magnetic noises). In some embodiments the resistors are dimensioned such that the combined resistance of the series of resistors leads to a current in the series of resistors when the IC component is in active state (see further) that is in the range of 0.5 to 5 mA (milliampere). In some embodiments this current is in the range of 1 to 3 mA (milliampere). In some embodiments this current is in the range of 1.5 to 2.5 mA (milliampere).

In some embodiments one or more of the resistors may have a resistor value of 100 ohms. In some embodiments all resistors may have the same resistor value. In some embodiments not all resistors have the same value. In some embodiments all resistors may have different resistor values, i.e., in some embodiments no two resistors have the same resistor value.

In some embodiments the ADC pullup/pulldown resistor may have a value of 100 kohm or similar (wherein 1 kohm denotes 1000 ohm). In some embodiments the capacitor may have a capacity of 100 picofarad or similar.

Another aspect of the invention provides an electronic apparatus comprising a keypad.

In some embodiments the apparatus may comprise a keypad comprising an electronic circuit (including an IC component) as described above whereby the switches of the circuit may be comprised in or may be activated by the buttons of the keypad. In some embodiments the IC component may comprise or may be comprised in one or more data processing components (such as for example one or more microprocessors, microcontrollers, Field Programmable Gate Arrays (FPGA), or Application Specific Integrated Circuit (ASIC)) of the apparatus.

Waiting for a Button of the Keypad to be Pressed.

In some embodiments the IC component may be configured or adapted to support a wait state. While in the wait state the IC component may be waiting for a button of the keypad to be pressed. The wait state may also be referred to as the wait-for-button-press state. While in the wait state the IC component may be configured as follows. At least a first one of the UP-pin or DOWN-pin may be configured as an input pin while the other of the UP-pin or DOWN-pin may be set as a virtual disconnect (it may, e.g., be configured as an input pin or as a tri-state pin). By means of a pullup resistor, which may be connected to the series of resistors, the voltage at the first one of the UP-pin or DOWN-pin that is configured as an input pin is pulled to high (for example, by configuring that pin as an input pin with pullup, or by adding an extra pullup resistor to the series of resistors that may connect, e.g., the UP-terminal or the DOWN-terminal to the high voltage). For example, the UP-pin may be configured as an input PIN with pullup. The ADC-pin may be configured as an output set to low (e.g., the ground voltage). As a result, in the wait state, as long as all the switches of the circuit are open, the voltage at the UP-pin and the DOWN-pin is high (because of the pullup).

When a button is pressed the corresponding switch will be closed. The result of closing a switch while the IC component is in wait state is that both the UP-terminal and the DOWN-terminal will be connected, through a number of resistors of the series of resistors, to the ADC-pin. Since the ADC-pin is being driven to low and the UP-pin and the DOWN-pin are set to input, the UP-pin (and the DOWN-pin) inputs will be driven to low. In some embodiments, the IC component may be configured to monitor the voltage at the UP-pin (or at the DOWN-pin) and to detect a transition from the high to the low voltage at the UP-pin (or at the DOWN-pin). The IC component may be further configured to interpret such a transition as indication that a button of the keypad is being pressed. The IC component may be further configured to generate a button-press-detection signal when it has thus detected that a button has been pressed. For example, in some embodiments the IC component may be further configured to have, while in the wait state, an interrupt triggered on a falling edge of the UP-pin (or at the DOWN-pin). If a button is pressed while the IC component is in the wait state, then the above explained transition of the UP-pin will trigger this interrupt. In some embodiments the IC component may be configured such that this interrupt causes the IC component to execute an interrupt routine for handling a button-press event. In some embodiments such an interrupt routine may cause the IC component to perform the steps of a method to determine which button has been pressed.

In some embodiments, the low and high voltage may be reversed in the above explanation, i.e., in some embodiments in the wait state the voltage at the input pin (i.e., the UP-pin and/or the DOWN-pin) may be pulled to low and the ADC-pin may be configured as an output set to high, and the input pin may detect a transition from the low to the high voltage (e.g., by an interrupt triggered on the rising edge of the input pin).

Determining which Button has been Pressed.

In some embodiments, the IC component may be further configured to support and enter an active state when it has detected a button press as explained above. In some embodiments, the IC component may be adapted to determine, when it is in this active state, which button has been pressed. The active state may also be referred to as the closed-switch-determination state. In some embodiments, the IC component may, when entering the active state, configure the ADC-pin to be an input pin, and configure the UP-pin and the DOWN-pin to be output pins outputting a different voltage. For example, in some embodiments the IC component may configure the DOWN-pin to output low, and the UP-pin to output high (or vice versa: configure the DOWN-pin to output high, and the UP-pin to output low). In some embodiments, the low voltage may correspond to the ground voltage and the high voltage may correspond to the supply voltage. In some embodiments, the IC component may be adapted to first configure the ADC-pin to input (from output in the wait state) before any of the UP-pin or DOWN-pin is configured to output with a voltage that is different than the voltage that the ADC-pin was driving when it was configured as an output voltage in the wait state. This may prevent, when a button is being pressed, undesirable peak currents to flow between on the one hand the ADC-pin and on the other hand the UP-pin or DOWN-pin that is configured to output a voltage that is different than the voltage that the ADC-pin was driving when it was configured as an output voltage in the wait state. This may be particularly relevant if the button that is being pressed is the switch that is closest to the UP-pin or DOWN-pin that is configured to output a voltage that is different than the voltage that the ADC-pin was driving when it was configured as an output voltage in the wait state.

The series of resistors now effectively acts as a voltage divider between the voltage of the UP-pin and the voltage of the DOWN-pin. The voltage at any node between any two consecutive resistors of the series of resistors is determined by the proportion of, on the one hand, the sum of the values of the resistors between the UP-pin and that node and, on the other hand, the sum of the values of the resistors between that node and the DOWN-pin, i.e., (voltage at node)= (voltage at DOWN-pin)+(voltage at UP-pin−voltage at DOWN-pin)*(sum of resistors between node and DOWN-pin)/(sum of series of resistors). In case of an extra resistor between the series of N−1 resistors and the DOWN-pin (see also above) and all resistors having the same value, this voltage at any node can be expressed as: Vnode=Vlow+ (Vdiff*i/N) wherein Vnode is the voltage at a certain node, Vlow is the voltage at the DOWN-pin, Vdiff is the voltage difference between the UP-pin and the DOWN-pin (which in some embodiments may be equal to the supply voltage), and 'i' denotes the position of the node counted from the DOWN-pin and starting at 1 for the node with the button closest to the DOWN-pin. This is also valid for the node connected to the switch of the pressed button. Since this button is pressed, the switch of this pressed button is closed and the voltage at the ADC-pin corresponds to the voltage at the node of the pressed button. That means that in active stage, the voltage at the ADC-pin, which is now configured to be an input pin, is given by the above relation and is fully determined by which button has been pressed. Vice versa, the voltage at the ADC-pin allows to deduce without ambiguity which button has been pressed.

In some embodiments, when the IC component is in active state the UP-pin, the DOWN-pin and the ADC-pin may be configured as explained above and the IC component may be further adapted to measure the voltage at the ADC-pin. For example, the ADC-pin may be adapted to provide an analog-to-digital convertor functionality to measure the voltage at the ADC-pin. In some embodiments the resolution of the analog-to-digital convertor at the ADC-pin should be sufficiently high to be able to distinguish with a certain margin the different voltage levels associated with different button presses. For example, in some embodiments the minimal required voltage difference that may be measurable by the analog-to-digital convertor at the ADC-pin may be a function of the minimal voltage difference between any two voltages associated with any two different button presses. For example, in some embodiments the minimal voltage difference that may be measurable by the analog-to-digital convertor at the ADC-pin, i.e. the resolution of the analog-to-digital convertor, may be smaller than half of the minimal voltage difference between any two voltages associated with any two different button presses. In some embodiments this resolution may be smaller than a fourth of the minimal voltage difference between any two voltages associated with any two different button presses. For example, in some embodiments the minimal voltage difference between any two voltages associated with any two different button presses may be 1/16 of the supply voltage and the resolution of the analog-to-digital convertor may be 8 bits. In some embodiments the IC component may use the measured voltage at the ADC-pin to deduce which button has been pressed.

In some embodiments, with a configuration in the active state as explained above, the voltage at the ADC-pin will be the voltage of the node corresponding to the button that is pressed (provided that only one button is pressed). In some embodiments the IC component may be adapted to determine which button is pressed from the voltage measured by the analog-to-digital convertor at the ADC-pin.

If the values of the resistors are known and the voltage values at the UP-pin and the DOWN-pin are also known, then the position of the node corresponding to the pressed button can be simply determined or calculated as a function of these known values. In some embodiments the IC component may be adapted to calculate the position of the pressed button by applying to the measured voltage the reverse function of the function (given above) that gives the voltage at the node as a function of the position of the node. In some embodiments the IC component may store (e.g., in a non-volatile memory) for each button a reference voltage that may have been calculated once with the function (given above) that gives the voltage at the node as a function of the position of the node and compare the measured voltage with these stored reference voltages to determine the pressed button.

In some embodiments the resistors of the circuit may be high precision resistors the value of which is known with sufficiently high precision for the above methods to give reliable results. In other embodiments, low-precision resistors (which may be cheaper than high-precision resistors) may be used such that the actual values of the resistors (which may deviate considerably from the nominal values) may not be known with sufficient accuracy for the above methods to work reliably. In some embodiments, the IC component may store (e.g., in a non-volatile memory) for each button a reference voltage and compare the measured voltage with these stored reference voltages to determine the pressed button, whereby the stored reference voltages may have been obtained (once) during a calibration phase.

Calibration

In some embodiments, a calibration phase may be applied to allow the IC component to measure the voltage at the ADC-pin for each button and store these measured voltages in a non-volatile memory to be used as reference voltages for determining which button is pressed. For example in some embodiments, during a calibration phase all the buttons may be pressed in a particular order, which may be known to or indicated by the IC component, and the IC component may measure and store the corresponding voltages at the ADC-pin. In some embodiments this calibration phase may be a part of a manufacturing method for an apparatus comprising the above described linear keypad circuit and IC component.

In some embodiments the IC component may be adapted to already detect and recognise button presses of a limited number of buttons prior to such a calibration phase. For example, in some embodiments the IC component may be adapted to detect and recognize presses of a button (which in some embodiments may be labelled as an 'OK' button) the corresponding switch of which is directly connected to the UP-pin or the DOWN-pin such that the voltage that will be measured at the ADC-pin will be equal to the voltage at the UP-pin or at the DOWN-pin and will not be affected by the actual values of the resistors in the series of resistors. In some embodiments prior to such a calibration phase the IC component may use a limited number of temporary reference voltages (which may for example be hardcoded in the firmware of the IC-component) to distinguish a limited number of button groups. For example the IC component may use the voltages that it normally applies in the active state to the UP-pin and the DOWN-pin as the reference voltages for the buttons that are positioned closest to the UP-pin and DOWN-pin and the IC component may be adapted to interpret any measured voltage at the ADC-pin that is closer to the UP-pin voltage than to the DOWN-pin voltage as a press of the button closest to the UP-pin and to interpret any measured voltage at the ADC-pin that is closer to the DOWN-pin voltage than to the UP-pin voltage as a press of the button closest to the DOWN-pin. Depending on the precision of the resistors that have been used, a higher number of temporary theoretical reference voltages may be used whereby the IC component may be configured to interpret a measured voltage at the ADC-pin as indicating a press of a button with a theoretical reference voltage that is closest to the measured voltage. This may permit limited interaction of an operator for example in a manufacturing phase prior to the completion of the calibration phase.

In some embodiments the IC component may store reference voltage values for determining the position of a pressed button in a non-volatile memory, such as flash or EEPROM (Electrically Erasable Programmable Read Only Memory) memory.

In some embodiments an apparatus comprising the above described linear keypad circuit and IC component may be adapted to function at more than one supply voltage and the IC component may be adapted to scale any stored reference voltages for determining which button has been pressed as a function of the actual supply voltage.

Advantages of the Invention

One advantage of the embodiments of the invention described above is that they only use three pins of an IC component (such as a microcontroller) connected to a keypad corresponding to the invention, which may permit the usage of a processor with a lower pin count (and lower cost) than would be possible if for example a matrix keypad with the same number of buttons would be used.

One aspect of the invention comprises an electronic keypad circuit, which elsewhere in this description may also be referred to as a linear keypad circuit. The electronic keypad circuit (or linear keypad circuit) may comprise a number of N switches and a number of L resistors whereby the L resistors are connected in series such that each terminal of each one of the L resistors is connected to one corresponding terminal of another one of the L resistors, except for a first terminal of the first resistor of the series of L resistors which is connected to a first end node of the circuit and for a second terminal of the last resistor of the series of L resistors which is connected to a second end node (whereby the nodes of the series of L resistors that are connected to two resistors of the series of L resistors may be referred to as intermediate resistor nodes); and whereby each switch of the N switches is connected through a first terminal to a common third node of the circuit and through a second terminal to one of the L resistors, i.e., to one of the nodes of the series of L resistors (which may be one of the intermediate resistor nodes or one of the first or second end nodes). In some embodiments no two different switches of the N switches are connected to the same terminal of the same resistor of the L resistors, i.e., at each node of the series of L resistors at most one switch is connected. In some embodiments each resistor is connected to at least one switch. In some embodiments each terminal of each resistor is connected to at most one switch. In some embodiments each terminal of each resistor is connected to at least one switch. In some embodiments each terminal of each resistor is connected to exactly one switch. In some embodiments the number of switches is one more than the number of resistors, i.e., $N=L+1$. In some embodiments each terminal of each resistor, except a resistor terminal connected to either the first or the second end node, is connected to exactly one switch. In some embodiments the number of switches is equal to the number of resistors, i.e., $L=N$. In some embodiments each terminal of each resistor, except the resistor terminal connected to the first end node and the resistor terminal connected to the second end node, is connected to exactly one switch. In some embodiments the number of switches is one less than the number of resistors, i.e., $N=L-1$.

In some embodiments the electronic keypad circuit may further comprise a number of buttons or keys and at least one or some or all of the switches of the electronic keypad circuit may be comprised in these buttons or keys or may be connected to these buttons or keys such that they may be closed if the button or key that they are comprised in or connected to is being pressed, e.g., by a user of an apparatus that the electronic keypad circuit may be comprised in.

In some embodiments the number of buttons or the number N of switches is 3. In some embodiments the number of buttons or the number N of switches is 4. In some embodiments the number of buttons or the number N of switches is at least 5 and at most 8. In some embodiments the number of buttons or the number N of switches is 9. In some embodiments the number of buttons or the number N of switches is 10. In some embodiments the number of buttons or the number N of switches is at least 11.

In some embodiments the electronic keypad circuit may be connected to a number of pins of a digital electronic component and the digital electronic component may be adapted to detect if a button of the electronic keypad circuit is being pressed and, if so, which particular button is being pressed. In some embodiments the digital electronic component may do this detection in two phases. The digital electronic component may detect in a first phase whether one of the buttons is being pressed, and may then, in a second phase, determine which particular button is being pressed. For example, in some embodiments the digital electronic component may be configured to be in a state, which may be referred to in the remainder of this description as the wait-for-button-press state or just the wait state, wherein it waits for a button to be pressed and wherein it is configured to detect whether a button is being pressed and to generate a signal that a button is being pressed when it detects that a button is being pressed. The digital electronic component may further be configured to switch, upon the generation of such a signal, to another state, which may be referred to in the remainder of this description as the closed-switch-determination state, for determining which button has been pressed.

The number of pins of the digital electronic component may differ from one embodiment to another. In some embodiments the digital electronic component may comprise two pins that are connected to the electronic keypad circuit. For example, one pin of the digital electronic component may be connected to the common third node and another pin may be connected to one of the end nodes of the series of L resistors while the other end node of the series of L resistors may be permanently connected to a fixed voltage. In other embodiments the digital electronic component may comprise three pins that are connected to the electronic keypad circuit. For example, one pin of the digital electronic component may be connected to the common third node, another pin of the digital electronic component may be connected to one of the end nodes of the series of L resistors and still another pin of the digital electronic component may be connected to the other end node of the series of L resistors.

In some embodiments the configuration of one or more of the pins (i.e., whether they are input or output pins and, in case they are output pins, which voltage they are driving) of the digital electronic component that are connected to the electronic keypad circuit, may change depending on the state of the digital electronic component.

Waiting for a Switch to be Closed.

In some embodiments the electronic keypad circuit may be connected to a digital electronic component. In some embodiments the digital electronic component may be configured to support a wait-for-button-press state. In some embodiments the digital electronic component may be waiting for one of the switches of the electronic keypad circuit to be closed while it is in this wait-for-button-press state. In some of the embodiments the digital electronic component may be configured to detect if one of the switches is closed while it is in the wait-for-button-press state.

In some embodiments, while the digital electronic component is in the wait-for-button-press state, the series of L resistors is connected to a first reference voltage and the common third node is connected to a second reference voltage that is different from the first reference voltage, whereby the series of L resistors is further substantially isolated from any voltage that is different from the first reference voltage, such that the terminals of the resistors of the series of L resistors are at the first reference voltage (as long as all N switches remain open).

In some embodiments the digital electronic component may comprise at least a first pin that is configurable as an input pin. In some embodiments the first pin may be connected to one of the nodes of the electronic keypad circuit, which node may be further referred to as the monitoring node. In some embodiments the monitoring node that the input pin is connected to may be or may comprise the common third node of the electronic keypad circuit. In other embodiments the first pin may be connected to the series of L resistors of the electronic keypad circuit. The monitoring node that the first pin may be connected to, may comprise one of the nodes of the series of L resistors. For example, in some embodiments the first pin may be connected to the first end node of the electronic keypad circuit, or the first pin may be connected to the second end node of the electronic keypad circuit, or the first pin may be connected to an intermediate node of the series of L resistors, or the first pin may be connected to a terminal of one of the L resistors of the electronic keypad circuit. In some embodiments the first input pin may be connected to the series of L resistors of the electronic keypad circuit by means of an extra resistor. This extra resistor preferably has a low resistance.

In some embodiments the first reference voltage may be a high voltage and the second reference voltage may be a low voltage. In other embodiments the first reference voltage may be a low voltage and the second reference voltage may be a high voltage. In some embodiments the high voltage may be the supply voltage of the electronic circuit or the apparatus in which the electronic keypad circuit is comprised. In some embodiments the low voltage may be the ground voltage of the electronic circuit or the apparatus in which the electronic keypad circuit is comprised.

In some embodiments, while the circuit is in the wait state, the first pin may be configured as a digital input pin capable of detecting a low or a high voltage level and the digital electronic component will interpret these as digital 'HIGH' and 'LOW' signals. For example, if the voltage at the input pin is above a particular high threshold voltage then the input pin will interpret this voltage as a digital 'HIGH' signal and if the voltage at the input pin is below a particular low threshold voltage then the input pin will interpret this voltage as a digital 'LOW' signal. In other embodiments, while the circuit is in the wait state, the input pin may be configured as an analog-to-digital convertor (ADC) pin capable of measuring the analog voltage at the input pin and generating a digital number representative (within the precision of the ADC) of the measured voltage at the input pin.

All Switches are Open

While all N switches are open, the nodes of the series of L resistors on the one hand and the common third node of the electronic keypad circuit on the other hand are isolated from each other. All nodes of the series of L resistors have the same voltage, i.e. the first reference voltage. The voltage at the common third node, on the other hand, is the second reference voltage. No current is flowing through the series of L resistors and no current is flowing between any of the nodes of the series of L resistors on the one hand and the common third node of the electronic keypad circuit on the other hand. The first pin (which is configured as an input pin) senses a (constant) voltage which, depending on whether the first pin is connected to the common third node or to the series of L resistors, is either the second reference voltage or the first reference voltage.

A Switch is Closed

When any of the switches is closed, the common third node is no longer isolated from the series of L resistors and a current will flow through the closed switch between the source of the first reference voltage and the source of the second reference voltage. This current not only flows through the closed switch but also through any resistor that is on the path between the source of the first reference voltage and the closed switch or on the path between the closed switch and the source of the second reference voltage. This may include some resistors of the series of L resistors (depending on which switch is closed and how the series of L resistors is connected to the source of the first reference voltage), as well as extra resistors that may connect the source of the first reference voltage to the series of L resistors or that may connect the source of the second reference voltage to the common third node. The flowing current will cause the voltages at all circuit nodes that are on this path of the flowing current and that are separated from the sources of the first and second reference voltage by at least one resistor, to change from either the first reference voltage (for the nodes of the series of L resistors) or the second reference voltage (for the common third node) to some other voltage that is between the first and the second reference voltage.

By a judicious choice of the monitoring node (or nodes) of the electronic keypad circuit that the first pin is connected to (directly or indirectly through e.g. a resistor preferably with a low resistance value), and by a judicious choice of how the first voltage is connected to the series of L resistors (i.e., to which nodes of the series of L resistors it is connected and what the resistance value is of the connection between the first reference voltage and the series of L resistors), and by a judicious choice of how the second reference voltage is connected to the common third node (i.e. what the resistance value is of the connection between the second reference voltage and the common third node), it can be ensured that the voltage at the monitoring node when any of the switches is closed will always be different than the voltage at the monitoring node when all switches are open.

I.e., it can be ensured by such judicious choices that when any of the switches is closed (regardless of exactly which switch is closed) the first pin will sense a voltage that is different than the voltage is was sensing while all switches were open. Exactly which voltage the first pin will sense when a switch is closed may depend on exactly which switch is closed.

To limit the current that flows between the first and second reference voltages when a switch is closed, to a value that is acceptable regardless of which switch is closed, it is preferable that the circuit is configured such that the combined resistance of the resistors on the path that the current follows is always sufficiently high regardless of which switch is closed. In some embodiments this can be ensured by connecting the source of the first reference voltage to the series of L resistors through a first extra connecting resistor and/or by connecting the source of the second reference voltage to the common third node through a second extra connecting resistor, and choosing the resistance values of the first and/or second extra connecting resistors to be sufficiently high.

Detecting that a Switch is Closed

In some embodiments the digital electronic component may be configured to monitor the voltage at the first pin. The digital electronic component may be further adapted to detect (while it is in the wait state to detect whether a button has been pressed) whether this voltage at the first pin changes (due to a switch that is closed as described above) or whether the voltage at the first pin is a different voltage than the voltage that may be expected when none of the switches is closed, and to interpret this voltage change or this other voltage at the first pin as a sign that a button is being pressed. The digital electronic component may be further adapted to generate a signal that it has detected that a button is being pressed if it detects such a voltage change or such a different voltage at the first pin. For example, in some embodiments the digital electronic component may comprise a microprocessor and may be configured to generate an interrupt that is triggered by the transition of the voltage at the first pin from the first reference voltage to another voltage that is closer to the second reference voltage. In some embodiments, while the digital electronic component is in the wait state, the first pin may be configured as a digital input pin. In some other embodiments, while the digital electronic component is in the wait state, the first pin may be configured as an analog-to-digital convertor pin (ADC) and the digital electronic component may be configured to poll the voltage measured by the first pin to check for a voltage change or to check for a different voltage than the voltage that may be expected when all switches are open.

Various embodiments may have different configurations with respect to, for example, how exactly the series of L resistors is connected to the first reference voltage and how exactly the common third node is connected to the second reference voltage, to how many and which pins of the digital electronic component the electronic keypad circuit is connected to the digital electronic component, and how the pins of the digital electronic component that are connected to the electronic keypad circuit are configured (i.e., whether they are connected as an input pin or an output pin, and when they are connected as an output pin which voltage they are driving).

First Set of Exemplary Embodiments

For example, in a first set of exemplary embodiments, while the digital electronic component is in the wait-for-button-press state, one of the nodes, for example the first or the second end node, of the electronic keypad circuit may be connected to the first reference voltage, e.g., through a first extra connecting resistor, and the common third node may be connected to the first pin which may be configured as an input pin and which may be further connected with a pullup or pulldown resistor (acting as a second extra connecting resistor) to the second reference voltage. In some embodiments, the pullup or pulldown pin may be comprised in the digital electronic component.

In some embodiments, during the wait-for-button-press state, only one of the first or second end nodes of the electronic keypad circuit may be connected to the first reference voltage and the other end node may be virtually disconnected (while no button is being pressed). In other embodiments both end nodes may be connected to the first reference voltage during the wait-for-button-press state. An end node that is connected to the first reference voltage may be connected to the first reference voltage source directly or indirectly through an extra connecting resistor, or may be connected to an extra pin of the digital electronic component that is configured as an output pin and that is driving the first reference voltage.

While none of the N switches is closed, the series of L resistors remains connected to the first reference voltage, the common third node of the electronic keypad circuit remains connected to the second reference voltage, and the series of L resistors and the common third node remain isolated from each other. Thus, all the nodes of the series of L resistors are at the first reference voltage, and the common third node is at the second reference voltage. As a consequence, as long as none of the N switches is closed, the voltage that the first pin (which is connected to the common third node) senses is the second reference voltage.

However, when at least one of the switches is closed (i.e. because a button is being pressed), the series of L resistors will now be connected (through the closed switch) to the common third node. A current will flow through the closed switch between the first reference voltage and the second reference voltage. This current also flows through the second extra connecting resistor (i.e. the pullup or pulldown resistor connecting the source of the second reference voltage to the first pin, which is also connected to the common third node terminal of all switches and thus also the closed switch). This has the effect of pulling the voltage at the common third node away from the second reference voltage towards the first reference voltage. The exact voltage at the common third node, that is sensed by the input pin, that arises when a switch is closed, depends on the values of the first and second reference voltages, and the ratio between on the one hand the resistance of the second extra connecting resistor (i.e., the pulldown or pullup resistor) and on the other hand the combined resistance of the first extra connecting resistor (if present) and the resistors of the series of L resistors that are on the path that the current follows between the source of the first reference voltage and the closed switch.

In some embodiments the first pin may be configured, during the wait-for-button-press state, as an analog-to-digital converter pin. The digital electronic component may be configured, during the wait-for-button-press state, to regularly poll the measured voltage value at the first pin. If the measured value of the voltage at the first pin is found to be sufficiently different from the second reference voltage, the digital electronic component may be configured to consider this as a sign that a switch has been closed, i.e., that a button is being pressed.

In other embodiments, the first pin may be configured, during the wait-for-button-press state, as a digital input pin and the digital electronic component may for example be configured to be triggered by a rising or falling edge (depending on whether the second reference voltage is lower or higher than the first reference voltage) of the first pin, and the ratio between on the one hand the resistance of the second extra connecting resistor (i.e., the pulldown or pullup resistor) and on the other hand the combined resistance of the first extra connecting resistor (if present) and the resistors of the series of L resistors that are on the path that the current follows between the source of the first reference voltage and the closed switch may be configured to be sufficiently high to ensure that, whichever switch is closed, the voltage change at the first pin when a switch is closed, will be sufficiently high to cause the digital electronic component to be triggered by a rising or falling edge from the voltage change at the first pin resulting from a switch being closed.

Second Set of Exemplary Embodiments

In a second set of exemplary embodiments the electronic keypad circuit may be connected to a digital electronic component having at least two different pins, namely a first pin which is configurable as an input pin and a second pin which is configurable as an output pin, whereby the second pin may be connected to the common third node of the electronic keypad circuit and the first pin may be connected to the series of L resistors of the electronic keypad circuit. The first pin may be connected to one of the nodes of the series of L resistors. For example, in some embodiments the first pin may be connected to the first end node of the electronic keypad circuit, or the first pin may be connected to the second end node of the electronic keypad circuit, or the first pin may be connected to an intermediate node of the series of L resistors, or the first pin may be connected to a terminal of one of the L resistors of the electronic keypad circuit. In some embodiments the first input pin may be connected to the series of L resistors of the electronic keypad circuit by means of an extra resistor. This extra resistor preferably has a low resistance.

While the digital electronic component is in the wait-for-button-press state, the series of L resistors may be connected to the first reference voltage, the first pin may be configured to be an input pin and the second pin may be configured to be an output pin, and the digital electronic component may be configured to drive the second pin to the second reference voltage, whereby the series of L resistors is further substantially isolated from any voltage that is different from the first reference voltage, such that the terminals of the resistors of the series of L resistors are at the first reference voltage (as long as all N switches remain closed). In the following paragraphs the wait-for-button-press state may also be referred to simply as the wait state.

While no button is being pressed, all switches are open, and the series of L resistors is only connected to the first reference voltage and remains isolated from any other voltage in particular from the second reference voltage driven by the second pin. Therefore, while no button is being pressed, all nodes of the series of L resistors are at the first reference voltage, no current flows through the electronic keypad circuit and no electric power is consumed by the electric keypad circuit. When a button is being pressed however, the corresponding switch closes and the second pin (which is outputting the second reference voltage) is connected to the series of L resistors through the closed switch, such that the series of L resistors is now connected both to the first reference voltage (at the one or more nodes of the series of L resistors connected to the first reference voltage) and the second reference voltage (at the node connected to the closed switch) and current is flowing between the nodes connected to the first reference voltage and the node connected to the closed switch. In order to avoid a short circuit, it is preferable that the series of L resistors is connected to the first reference voltage in such a way that the resistance between the first reference voltage and any node of the series of L resistors that is connected to one of the N switches is high enough to limit the current that flows when a switch is closed to an acceptable value.

In some embodiments the series of L resistors may be connected to the first reference voltage through a highly resistive connection. In some embodiments the resistance of the highly resistive connection that connects the series of L resistors to the first reference voltage is considerably higher than the combined resistance of the series of L resistors. For example, in some embodiments the resistance of the highly resistive connection may be at least 4 times or at least 10 times or at least 50 times as high as the combined resistance of the series of L resistors. For example, in some embodiments the highly resistive connection may comprise a pull-up or pull-down resistor which may for example connect the first pin to the first reference voltage. In some embodiments such a pull-up or pull-down resistor may be comprised in the digital electronic component.

In some embodiments either the first end node or the second end node of the series of L resistors is connected to the first reference voltage during the wait state. In some embodiments either the first end node or the second end node of the series of L resistors is connected to the first reference voltage during the wait state and the other end node may be connected to the first pin. In some embodiments one of the intermediate nodes of the series of L resistors is connected to the first reference voltage during the wait state. In some embodiments more than one node of the series of L resistors is connected to the first reference voltage during the wait state. In some embodiments both the first end node and the second end node of the series of L resistors is connected to the first reference voltage during the wait state. In some embodiments at least one intermediate node and at least one of the first end node and the second end node of the series of L resistors is connected to the first reference voltage during the wait state. In some embodiments only the first end node or the second end node of the series of L resistors is connected to the first reference voltage and this end node is permanently (i.e., not only during the wait state) connected to the first reference voltage.

Detecting that a Switch is Closed.

While none of the N switches is closed, the series of L resistors remains connected to the first reference voltage and remains isolated from the second reference voltage output at the second pin of the digital electronic component and thus all the nodes of series of L resistors are at the first reference voltage. As a consequence, as long as none of the N switches is closed, the voltage that the first pin (which is connected to the series of L resistors) senses is the first reference voltage. However, when at least one of the switches is closed (i.e. because a button is being pressed), the series of L resistors will now be connected (through the closed switch) to the second pin. Since the second pin is an output pin and the digital electronic component is configured to drive the second pin to the second reference voltage, a current will flow between the between the nodes connected to the first reference voltage and the node connected to the closed switch and thus connected to the second reference voltage. This has an effect on the voltages at all the various nodes of the series of L resistors such that these voltages will no longer be equal to the first reference voltage. This also applies to the voltage at the node connected to the first pin (which is connected to the series of L resistors) so that the voltage sensed by the first pin also changes. The exact voltages at the different nodes of the series of L resistors and the exact voltage that is sensed by the input pin that arise when a switch is closed, depend on the following factors: the values of the first and second reference voltages, which of the N switches is closed, and which nodes of the series of L resistors are connected to the first reference voltage and to the first pin.

Limiting Power Consumption

In some embodiments, it is important to keep the power consumption of the apparatus comprising the linear keypad circuit as low as possible. While the digital electronic component is in the wait state and no switch is closed, there is no current and hence no power consumption. When a switch is closed, a current will flow and thus there will be some power consumption. The current and thus the power consumption is in any case limited by the resistance of the connection between the series of L resistors and source of the first reference voltage. In some embodiments the power consumption may be limited by choosing the resistance of this connection between the series of L resistors and the source of the first reference voltage to be sufficiently high. In some embodiments, the digital electronic component may be configured to no longer drive the second pin to the second reference voltage (for example, by configuring the second pin to be an input pin or by setting it into a tri-state mode) as soon as the digital electronic component has detected that a switch is closed.

For example, in some embodiments the series of L resistors may be connected to the first reference voltage through a highly resistive connection, whereby the resistance of the highly resistive connection connecting the series of L resistors to the first reference voltage may be considerably higher than the combined resistance of the series of L resistors. Because in such embodiments the combined resistance of the series of L resistors is considerably lower than the resistance of the highly resistive connection connecting the series of L resistors to the first reference voltage, the voltages at the terminals of the resistors of the series of L resistors will be driven to a voltage that is closer to the second reference voltage of the second pin than to the first reference voltage regardless of which switch is closed and regardless of which node of the series of L resistors is connected to the first reference voltage; and because the first pin (which is configured as an input pin) is connected to the series of L resistors, the voltage at the first pin will now also be driven closer to the second reference voltage of the second pin than to the first reference voltage. In other words, when at least one switch is closed, the first pin will no longer sense the first reference voltage, but will now sense a voltage that is closer to the second reference voltage of the second pin than to the first reference voltage. The digital electronic component may be configured to monitor the voltage at the first pin. The digital electronic component may be further configured to detect whether the voltage at the first pin is now at a voltage that is closer to the second reference voltage of the second pin than to the first reference voltage, and, if it does detect this condition, to generate a signal that it has detected that a switch is closed. In some embodiments the digital electronic component may be configured to detect a voltage change at the first pin from the first reference voltage to a voltage that is closer to the second reference voltage of the second pin than to the first reference voltage, and, if it does detect this condition, to generate a signal that it has detected that a switch is closed. In these embodiments, the high resistance of the highly resistive connection is always on the path between the first reference voltage and the second reference voltage that is being driven by the second pin when a switch is closed, regardless of which switch is closed. Therefore, in these embodiments, the current drawn by the second pin when a switch is closed will always be limited by at least the high resistance of the highly resistive connection, regardless of which switch is closed.

In some embodiments the first pin may be configured as a digital input pin and the first reference voltage may be the 'HIGH' (or 'LOW') voltage and the second reference voltage may be the 'LOW' (or 'HIGH') voltage. While all the switches are open, the voltage at the first digital input pin is the first reference voltage and the first digital input pin generates the corresponding 'HIGH' (or 'LOW') signal. If the resistance of the highly resistive connection is sufficiently high (with respect to the combined resistance of the series of L resistors) then, when one of the L switches is closed, the voltage at the first digital input pin will change and will become sufficiently close to the second reference voltage to be interpreted by the first digital input pin as corresponding to the 'LOW' (or 'HIGH') voltage and the first digital input pin will generate the corresponding 'LOW' (or 'HIGH') digital signal. In some embodiments the digital electronic component may be configured to be triggered by a falling (or rising) edge and the digital electronic component may be configured to interpret such a falling (or rising) edge as a sign that a switch has been closed and thus that a button is being pressed.

In some other exemplary embodiments, the series of L resistors may be connected to the first reference voltage through an extra resistor that is connected to one of the end nodes of the series of L resistors and the first input pin may be connected to the other end node of the series of L resistors. When one of the switches is closed, the voltages at the nodes of the series of L resistors between the node connected to the closed switch until the node connected to the input pin will take the same voltage as the voltage at the node connected to the closed switch. As a consequence, when a switch is closed, the voltage at the first input pin will be equal to the second reference voltage.

In still some other exemplary embodiments, the resistance of the connection that connects the series of L resistors to the first reference voltage is of the same order of magnitude as the combined resistance of the series of L resistors. As long as none of the switches is closed, the voltages at the various nodes of the series of L resistors, and hence also at the first input pin, remains equal to the first reference voltage. When a switch is closed (because a button is being pressed), the series of L resistors is also being connected, through the closed switch, to the second reference voltage (that is being driven by the second pin that is connected to all switches). The difference between the first reference voltage and the second reference voltage causes a current to flow from the source of the first reference voltage through the connection that connects the series of L resistors to the first reference voltage, the resistors of the series of L resistors that are on the path between the connection with the first reference voltage and the closed switch, and the closed switch, to the second pin (that is connected to all switches and thus also to the closed switch). This current causes a voltage drop over the connection that connects the series of L resistors to the first reference voltage, and an additional voltage drop over the resistors of the series of L resistors that are on the path between the connection with the first reference voltage and the closed switch. As a consequence, the voltage in the various nodes of the series of L resistors, and thus also at the first input pin, is no longer equal to the first reference voltage. The voltage change at the first input pin is at least as big as the voltage drop over the connection that connects the series of L resistors to the first reference voltage.

Determining which Switch is Closed.

In some embodiments the digital electronic component may be adapted to support a closed-switch-determination state. In some embodiments the digital electronic component may be configured to determine, when it is in the closed-switch-determination state, which of the N switches is closed. In some embodiments the digital electronic component may be configured to enter the closed-switch-determination state after it has determined that one of the N switches is closed (for example through any of the methods described elsewhere in this description to detect that one of the N switches of the linear keypad circuit has been closed). For example, in some embodiments the digital electronic component may be configured to enter the closed-switch-determination state after it has determined, for example while it was in the wait state as described above, that one of the N switches is closed.

Debouncing Time

In some embodiments the digital electronic component may wait, after it has determined that one of the N switches is (being) closed, for a certain debouncing time for the switch that is being closed to stabilize before entering the closed-switch-determination state. In some embodiments the debouncing time may be at most 50 milliseconds. In some embodiments the debouncing time may be at least 10 milliseconds. In some embodiments, the electronic keypad circuit may comprise a capacitor that connects the first input pin to a fixed voltage to dampen any debouncing jitter of the voltage at the first input pin.

In some embodiments the digital electronic component may comprise a third pin. While the digital electronic component is in the closed-switch-determination state the third pin may be connected to the common third node of the linear keypad circuit. While the digital electronic component is in the closed-switch-determination state the third pin may be configured as an input pin capable of measuring the voltage at the common third node of the linear keypad circuit. For example, in some embodiments the third pin may be an analog-to-digital convertor (ADC) pin capable of measuring the voltage at the common third node and generating a digital numeric value representative of the measured voltage.

In some embodiments, during the closed-switch-determination state, one end node (i.e., one of the first end node or second end node) of the series of L resistors may be connected to a third reference voltage and the other end node (i.e., the other one of the first end node or second end node) of the series of L resistors may be connected to a fourth reference voltage that is different from the third reference voltage. In some embodiments the series of L resistors is not connected to any other voltage source. In some embodiments none of the nodes of the series of L resistors other than the end nodes (i.e. none of the intermediate nodes) are connected to any voltage source. In some embodiments the common third node is not connected to any voltage source that drives the voltage to a particular voltage. In some embodiments the third pin may be the same pin as a pin that during the wait-for-button-press state is connected to the common third node. For example, in some embodiments, such as some embodiments of the first exemplary set of embodiments described in connection to the wait-for-button-press state, the third pin may be the same as the first pin that in the wait-for-button-press state is connected to the common third node and which may be configured in the closed-switch-determination state as an analog-to-digital convertor (ADC) pin. For example, in some other embodiments, such as some embodiments of the second exemplary set of embodiments described in connection to the wait-for-button-press state, the third pin of the digital electronic component may be the same as the second pin, whereby this second pin, which is configured as an output pin driving the common third node to the second reference voltage during the wait state, may be configured to be an input pin during the closed-switch-determination state. In other embodiments the third pin of the digital electronic component may be different from another pin that during the wait-for-button-press state is connected to the common third node, such as for example the second pin in some embodiments of the second exemplary set of embodiments described in connection to the wait-for-button-press state, whereby this second pin, which is configured as an output pin driving the common third node to the second reference voltage during the wait state, may be configured to no longer drive the common third node to the second reference voltage during the closed-switch-determination state, e.g., by configuring the second pin to be an input pin or to be in a non-driving high-impedance tri-state during the closed-switch-determination state.

In some embodiments the third reference voltage may be the same as the first reference voltage, additionally the fourth reference voltage may be the same as the second reference voltage. In other embodiments the third reference voltage may be the same as the second reference voltage, and additionally the fourth reference voltage may be the same as the first reference voltage.

In some embodiments one of the end nodes of the series of L resistors may be connected to a fourth pin of the digital electronic component which, during the closed-switch-determination state, may be configured as an output pin driving one of the third or fourth reference voltages. In some embodiments the other end node of the series of L resistors may be permanently connected (directly or indirectly through an extra connecting resistor) to a source of the other of the third or fourth reference voltages, while in other embodiments the other end node of the series of L resistors may be connected to a fifth pin of the digital electronic component which, during the closed-switch-determination state, may be configured as an output pin driving the other of the third or fourth reference voltages. In some embodiments, the fourth and/or fifth pin may be the same as a pin of the digital electronic component which during the wait-for-button-press state may be connected to the same end node of the series of L resistors.

Because the voltages at both ends of the series of L resistors are different, a current flows from one end node to the other end node of the series of L resistors which causes a voltage drop over each of the resistors of the series of L resistors. Since the resistors of the series of L resistors are connected in series, the voltage at any particular node of the series of L resistors has a specific and unique value that is fully and uniquely determined by the difference between the third and fourth reference voltages, the resistance value of each of the resistors of the series of L resistors and the specific position of that particular node in the series of L resistors. More specifically, if the expression 'sum_of_resistances_until_node' represents the sum of the resistances of all resistors between a particular node and the end node of the series of L resistors connected to the third reference voltage and the expression 'sum_of_all_resistances' represents the sum of the resistances of all resistors of the series of L resistors and the expression voltage_difference_between_end_nodes represents the difference of the voltage at the end node connected to the fourth reference voltage minus the voltage at the end node connected to the third reference voltage, then the voltage at that particular node is given by the formula (((voltage_difference_between_end_nodes)*sum_of_resistances_until_node/sum_of_all_resistances)+voltage_at_end_node_connected_to_third_reference_voltage). Since the value of the expression 'sum_of_resistances_until_node' is unique for each particular node of the series of L resistors, also the voltage at each particular node is unique and characteristic for that particular node. That means that the position of a particular node is fully defined if the voltage at that particular node is given. This is also the case for the node that is connected to the closed switch. The voltage at the third pin is the same as the voltage of the node that is connected to the closed switch, so that from the voltage at the third pin the position of the node connected to the closed switch can be deduced. This means that it can be deduced from the voltage at the third pin which switch is closed and thus which button is being pressed. In some embodiments all resistors of the series of L resistors have essentially the same or similar resistance value. For example, in some embodiments all resistors of the series of L resistors have the same nominal resistance value.

In some embodiments the digital electronic component may be adapted to measure the voltage at the third pin and to deduce from the measured voltage which switch is closed, and thus which button is being pressed. In some embodiments, during the closed-switch-determination state, the third pin may be configured as an input pin capable of measuring the voltage at the common third node that it is connected to. For example, the third pin may be configured during the closed-switch-determination state to be an analog-to-digital convertor (ADC) pin. In some embodiments the digital electronic component may know the values of the resistances in the chain of resistors between the third and fourth reference voltages and may be adapted to determine which switch is closed by calculating the position of the node connected to the closed switch as a function of the measured voltage at the third pin and the known resistance values. In some embodiments the digital electronic component may store of may otherwise have access to a list of reference voltages for at least some (preferably all) of the nodes that are connected to one of the switches of the set of N switches and the digital electronic component may be adapted to determine which switch is closed by comparing the measured voltage at the third pin and to these reference voltages, for example by determining that the switch that is closed is the switch that is connected to the node of which the reference voltage is closest to the measured voltage at the third pin.

Calibrating the Reference Voltages.

In some embodiments the digital electronic component may be adapted to support a calibration phase or state in which the digital electronic component may obtain the values of the reference voltages. In some embodiments, during the calibration phase, all the buttons of the linear keypad may be pressed one after the other and the digital electronic component may be adapted to measure the resulting voltages at the third pin and store these measured voltages as the reference voltages. In some embodiments the buttons are being pressed in a particular order and the digital electronic component is adapted to know this order and to deduce from this order with which switch or button to associate each measured voltage at the third pin as a reference voltage. In some embodiments the digital electronic component may be adapted to know the relative order of the switches or buttons in the electronic keypad circuit and may be adapted to order the different voltages that are measured at the third pin for the different key presses and to associate each of the ordered measured voltages as a reference voltage with a switch in the set of N switches that has the same order in the ordered list of switches as the order of the measured voltage in the list of ordered measured voltages.

In an exemplary set of embodiments, the first reference voltage and the third reference voltage may be the same and the second reference voltage and the fourth reference voltage may be the same. The first and third reference voltage may for example be one of a supply voltage or ground voltage of the electronic linear keypad circuit, and the second and fourth voltage reference value may the other of said supply voltage or ground voltage. In some embodiments of the second exemplary set of embodiments described in connection to the wait-for-button-press state, the second pin may be the same pin as the third pin and during the wait state this pin may be configured to drive the common third node to the second reference voltage and during the closed-switch-determination state this pin may be configured to be an input pin capable of measuring the voltage at the common third node. Both during the wait state and the closed-switch-determination state the first and third reference voltage may be connected to a first end node of the series of L resistors, whereby there is at least one resistor between the source of the first and third reference voltage and any node connected to one of the switches of the set of N switches. The first pin may be connected to the second end node, whereby the first pin may be configured during the wait state to be an input pin (e.g., a digital input pin, or an analog-to-digital convertor (ADC) pin) and may be configured during the closed-switch-determination state to drive the second end node of the series of L resistors to the fourth reference voltage. The resistance of the resistor between the source of the first and third reference voltage and the switch of the set of N switches that is connected closest to the first end node of the series of L resistors may be chosen to be large enough to limit to an acceptable value the current that flows through the chain of resistors during the closed-switch-determination state, notably in case that the switch that is closed is the switch that is closest to the first end node. The resistance of the resistor between the source of the first and third reference voltage and the switch of the set of N switches that is connected closest to the first end node of the series of L resistors may be chosen to be small enough so that the voltage drop over this resistor is not too large during the closed-switch-determination state so that the voltage drop over the other resistors of the series of L resistors is sufficiently large so that the voltage difference between any two successive nodes connected to switches of the set of N switches is sufficiently large with respect to the resolution of the analog-to-digital convertor of the third pin so that the analog-to-digital convertor of the third pin is capable of measuring a different voltage value for each different switch of the series of N switches. For example, in some embodiments the resistor between the source of the first and third reference voltage and the switch of the set of N switches that is connected closest to the first end node of the series of L resistors may be an extra resistor between the source of the first and third reference voltage and the first end node of the series of L resistors and the resistance of this extra resistor may for example be more or less equal (for example within a margin of 30% more or less) to the sum of the resistances of all resistors of the series of L resistors. In some other exemplary embodiments, the first end node of the series of L resistors is not connected to any switch of the set of N switches and the resistor between the source of the first and third reference voltage and the switch of the set of N switches that is connected closest to the first end node of the series of L resistors may comprise at least the first resistor of the series of L resistors. In some embodiments all resistors of the series of L resistors have essentially the same resistance value. In order to further limit the power consumption, the digital electronic component may be adapted to stop (during at least a certain period) driving the first pin to the fourth reference voltage once it has been detected that a button is being pressed and it has been determined which button is being pressed.

Limiting Power Consumption while a Switch is Closed.

As long as, during the closed-switch-determination state, there is a voltage difference between, on the one hand, one end node of the series of L resistors and, on the other hand, the other end node of the series of L resistors, a current will flow which causes power consumption. In some embodiments the resistance values of the resistors of the series of L resistors and (if applicable) the resistance values of any extra connecting resistors connecting one or both of the end nodes of the series of L resistors to the third and/or fourth reference voltages, may be chosen such that the total resistance of the combination of these resistors is sufficiently high to limit the current that flows through the series of L resistors to an acceptable value.

In some embodiments the digital electronic component may be configured to no longer maintain a voltage difference between the two end nodes of the series of L resistors as soon as it has been determined which switch is being pressed. In some embodiments, after it has been determined which switch is closed and as long as a switch is closed and except possibly for moments wherein the digital electronic component is configured to verify whether the closed switch has already been released, it may be ensured that the various nodes of the electric keypad circuit, i.e., the nodes of the series of L resistors and the common third node, are connected to at most one voltage, i.e. that all voltage sources that are connected to the electric keypad circuit provide the same voltage.

Detecting the Release of a Closed Switch.

In some embodiments the digital electronic component may be adapted to determine if a closed switch is released again. In some embodiments the digital electronic component may be adapted to support a wait-for-button-release state.

For example, in some embodiments the digital electronic component may be adapted to detect, while it is in the wait-for-button-release state, the release of a closed switch by regularly going back to the wait-for-button-press state and checking (polling) whether there is still a button being pressed. If at some point no button is being pressed, the digital electronic component may generate a signal that the pressed button has been released. In between the moments at which the digital electronic component checks whether the pressed button is still being pressed (and also after the digital electronic component has determined which button is being pressed), the digital electronic component may be configured to put the linear keypad circuit in a low power consumption mode. For example, in some embodiments, after the digital electronic component has determined which button is being pressed, the digital electronic component may configure the linear keypad circuit such that it is connected to at most one driving voltage. For example, in some embodiments, the digital electronic component may configure all pins connected to the linear keypad circuit as input pins or put them in a tri-state mode.

In other embodiments, the digital electronic component may be adapted to configure the linear keypad circuit, while it is in the wait-for-button-release state, as in the wait-for-button-press state except that now, while monitoring the voltage at the first input pin, it may wait for the voltage at the first input pin to return to the first reference voltage, i.e., the voltage that the first input pin normally senses in the wait-for-button-press state as long as no button is being pressed.

After the digital electronic component has detected that the pressed button has been released, the digital electronic component may leave the wait-for-button-release state and may go back to the wait-for-button-press state to wait for another button to be pressed.

In an aspect of the invention an electronic linear keypad circuit for providing a keypad and an electronic apparatus comprising such electronic linear keypad circuit are provided. In some embodiments the electronic linear keypad circuit may comprise any of the electronic keypad circuits described elsewhere in this description. In some embodiments the electronic apparatus may comprise any of the electronic apparatus described elsewhere in this description. Particular embodiments of the method are illustrated in FIG. 6.

In some embodiments the electronic linear keypad circuit (600) may comprise: a series (610) of L resistors (611, 612, 613), and a set (620) of N switches (621, 622, 623, 624); whereby all the resistors of the series of L resistors are connected in series whereby each resistor of the series of L resistors has two terminals and each terminal of each resistor is connected to an intermediate node (642, 643) that is further connected to a terminal of exactly one other resistor of the series of L resistors, except for a first resistor (611) of which a first terminal is connected to a first end node (641) of the series of L resistors that is not connected to any other resistor of the series of L resistors and of which a second terminal is connected to an intermediate node (642) that is further connected to a terminal of exactly one other resistor (612) of the series of L resistors, and except for a last resistor (613) of which a first terminal is connected to an intermediate node (643) that is further connected to a terminal of exactly one other resistor (612) of the series of L resistors and of which a second terminal is connected to a second end node (644) of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node (645) of the electronic linear keypad circuit.

In some embodiments the electronic apparatus (650) may further comprise a digital electronic component connected to the electronic linear keypad circuit, and a set of buttons whereby each button of the set of buttons comprises or is connected to a switch of the set of N switches and whereby if a button of the set of buttons is being pressed a corresponding switch of the set of N switches that is comprised in or is connected to the button is closed.

In some embodiments the electronic apparatus may be adapted to support a wait-for-button-press state to detect whether a button of the set of buttons is pressed. In some embodiments, while the apparatus is in the wait-for-button-press state: the series of L resistors is connected to a first reference voltage; the common third node of the electronic linear keypad circuit is connected to a second reference voltage that is different from the first reference voltage; a voltage change monitoring pin comprised in the digital electronic component is connected to a monitoring node of the electronic linear keypad circuit, the monitoring node comprising at least one of the first end node, the second end node, or an intermediate node of the series of L resistors or the common third node of the electronic linear keypad circuit; the voltage change monitoring pin is configured as an input pin; and wherein the digital electronic component is adapted: to monitor the voltage at the monitoring node; and to detect whether said voltage at said monitoring node changes or is different than an expected voltage when no button is pressed.

In some embodiments the voltage change monitoring pin is configured as a digital input pin and the digital electronic component is configured, during the wait-for-button-press state, to be triggered by a rising or falling edge of a voltage at the voltage change monitoring pin. In other embodiments the voltage change monitoring pin is configured as an analog-to-digital converter pin and wherein the digital electronic component is configured, during the wait-for-button-press state, to poll a measurement value of a voltage at the voltage change monitoring pin.

In some embodiments the monitoring node comprises the common third node of the electronic linear keypad circuit and wherein, while the apparatus is in the wait-for-button-press state, the voltage change monitoring pin is connected through a pull-up or pull-down resistor to the second reference voltage. In some embodiments the pull-up or pull-down resistor is comprised in the digital electronic component.

In other embodiments the monitoring node comprises at least one of the first end node, the last end node, or an intermediate node of the series of L resistors; and the digital electronic component comprises a second reference voltage output pin which is connected to the common third node and which, while the apparatus is in the wait-for-button-press state, is configured to be an output pin driving the common third node to the second reference voltage.

In some embodiments the monitoring node comprises one of the first end node or the second end node of the series of L resistors. In some embodiments the digital electronic component comprises a first reference voltage output pin which is connected to the other of the first end node or the second end node of the series of L resistors and which, while the apparatus is in the wait-for-button-press state, is configured to be an output pin driving said other of the first end node or the second end node of the series of L resistors to the first reference voltage. In other embodiments the other of the first end node or the second end node of the series of L resistors is connected to a fixed voltage source which provides the first reference voltage.

In some embodiments the electronic apparatus may comprise any of the previously described electronic apparatus further adapted to support a closed-switch-determination state to determine, after it has been detected that a button of the set of buttons is pressed, which button of the set of buttons is pressed. In some embodiments, while the apparatus is in the closed-switch-determination state: one of the first end node or the second end node of the series of L resistors is connected to a third reference voltage; the other of the first end node or the second end node of the series of L resistors is connected to a fourth reference voltage that is different from the third reference voltage; an intermediate voltage measuring pin comprised in the digital electronic component is connected to the common third node of the electronic linear keypad circuit; the intermediate voltage measuring pin is configured as an input pin capable of measuring the voltage at the intermediate voltage measuring pin; and the digital electronic component is adapted: to obtain a measurement of a voltage at the intermediate voltage measuring pin; and to determine from said voltage measurement which button is being pressed. In some embodiments the intermediate voltage measuring pin is configured as an analog-to-digital converter pin.

In some embodiments the electronic apparatus may comprise any of the previously described electronic apparatus wherein the digital electronic component comprises: a first pin that is connected to the common third node; a second pin that is connected to the first end node of the series of L resistors; and a third pin that is connected to the second end node of the series of L resistors; and wherein the apparatus supports a wait-for-button-press state to detect whether a button of the set of buttons is pressed, and a closed-switch-determination state to determine, after it has been detected that a button of the set of buttons is pressed, which button of the set of buttons is pressed; and wherein, while the apparatus is in the closed-switch-determination state, the digital electronic component is adapted: to configure the second pin as an output pin driving the first end node of the series of L resistors to a third reference voltage; to configure the third pin as an output pin driving the second end node of the series of L resistors to fourth reference voltage that is different from the third reference voltage; to configure the first pin as an input pin capable of measuring the voltage at the common third node; to measure a voltage at the common third node; and to determine from said measured voltage which button is being pressed; and wherein, while the apparatus is in the wait-for-button-press state, the digital electronic component is adapted: to configure the first pin, the second pin or the third pin as a voltage monitoring pin which is configured as an input pin; to monitor the voltage at the voltage monitoring pin; to detect whether said voltage at said monitoring voltage pin changes or is different than an expected voltage when no button is pressed; and to conclude, when it is detected that said voltage at said monitoring voltage pin has changed or is different than an expected voltage when no button is pressed, that a button is pressed.

In some embodiments, while the apparatus is in the wait-for-button-press state, the digital electronic component is adapted to configure one of the second pin or the third pin as the voltage monitoring pin, to configure the other of the second or the third pin as an output pin which drives the node to which the output pin is connected to a first reference voltage, and to configure the first pin as an output pin driving the common third node to a second reference voltage that is different from the first reference voltage.

In other embodiments, while the apparatus is in the wait-for-button-press state, the digital electronic component is adapted to configure at least one of the second pin or the third pin as an output pin driving the nodes of the series of L resistors to a first reference voltage and to configure the first pin as the voltage monitoring pin wherein the first pin is further configured as an input pin connected through a pullup or pulldown resistor to a second reference voltage that is different from the first reference voltage.

In some embodiments the third reference voltage is the same as the first reference voltage and the fourth reference voltage is the same as the second reference voltage, or wherein the third reference voltage is the same as the second reference voltage and the fourth reference voltage is the same as the first reference voltage.

In some embodiments the electronic apparatus may comprise any of the previously described electronic apparatus wherein the digital electronic component (650) comprises: a first pin (651) that is connected to the common third node (645); a second pin (652) that is connected to the first end node (641) of the series (610) of L resistors; and wherein the second end node (644) of the series of L resistors is connected to a fixed second reference voltage (690); and wherein the apparatus supports a wait-for-button-press state to detect whether a button of the set of buttons is pressed, and a closed-switch-determination state to determine, after it has been detected that a button of the set of buttons is pressed, which button of the set of buttons is pressed; and wherein, while the apparatus is in the closed-switch-determination state, the digital electronic component is adapted: to configure the second pin as an output pin driving the first end node of the series of L resistors to a first reference voltage that is different from the second reference voltage; and to configure the first pin as an input pin capable of measuring the voltage at the intermediate voltage measuring pin; to measure a voltage at the intermediate voltage measuring pin; and to determine from said measured voltage which button is being pressed; and wherein, while the apparatus is in the wait-for-button-press state, the digital electronic component is adapted: to configure either the first pin or the second pin as a voltage monitoring pin which is configured as an input pin; to monitor the voltage at the voltage monitoring pin; to detect whether said voltage at said monitoring voltage pin changes or is different than an expected voltage when no button is pressed; and to conclude, when it is detected that said voltage at said monitoring voltage pin has changed or is different than an expected voltage when no button is pressed, that a button is pressed.

In some embodiments, while the apparatus is in the wait-for-button-press state, the digital electronic component is adapted to configure the second pin as the voltage monitoring pin and the first pin as an output pin driving the common third node to the first reference voltage.

In other embodiments, while the apparatus is in the wait-for-button-press state, the digital electronic component is adapted to configure the first pin as the voltage monitoring pin wherein the first pin is further configured as an input pin connected through a pullup or pulldown resistor to the first reference voltage.

In some embodiments the step of determining from the measured voltage which button is being pressed comprises calculating the position of a node of the series of L resistors that is connected to a closed switch that corresponds to the button that is being pressed, as a function of the measured voltage. In some embodiments the step of determining from the measured voltage which button is being pressed further comprises calculating the position of a node of the series of L resistors that is connected to a closed switch that corresponds to the button that is being pressed, as a function of the measured voltage, the difference between the voltages at the first and second end nodes of the series of L resistors and the values of the resistances of the resistors of the series of L resistors.

In other embodiments the step of determining from the measured voltage which button is being pressed comprises comparing the measured voltage with a set of reference voltages. In some embodiments the step of determining from the measured voltage which button is being pressed further comprises the step of determining the button that is being pressed as being a button that is associated with one of the reference voltages.

In some embodiments the electronic apparatus may comprise any of the previously described electronic apparatus wherein the digital electronic component is further adapted to, during a calibration phase, measure for each switch of the set of N switches a calibration voltage and store the measured calibration voltages for use in the closed-switch-determination state in said step of determining which button is being pressed.

In some embodiments each stored calibration voltage is associated with a button corresponding with a switch that was closed when that stored calibration voltage was measured.

In some embodiments the electronic apparatus may comprise any of the previously described electronic apparatus further adapted to support a wait-for-button-release state detect whether a closed button is released again as is explained in more detail elsewhere in this description.

In an aspect of the invention a method is provided to detect whether a button of a linear keypad is being pressed. Some embodiments of the method may be used with various embodiments of the linear keypad described elsewhere in this description. Particular embodiments of the method are illustrated in FIG. 3.

In some embodiments the linear keypad may comprise an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit.

Some embodiments of the method may comprise any of the previously described embodiments of the method whereby the linear keypad may further comprise a set of buttons whereby each button comprises or is connected to a switch of the set of N switches and whereby if a button of the set of buttons is being pressed a switch of the set of N switches that is comprised in or is connected to the button is closed.

Some embodiments of the method (300) may comprise any of the previously described embodiments of the method wherein the method may comprise the steps of: connecting (310) the series of L resistors to a first reference voltage source, connecting (320) the common third node of the electronic linear keypad circuit to a second reference voltage that is different from the first reference voltage, and monitoring (330) the voltage at a monitoring node of the electronic linear keypad circuit, the monitoring node comprising at least one of the first end node, the last end node, or an intermediate node of the series of L resistors or the common third node of the electronic linear keypad circuit, to detect (340) if said voltage at said monitoring node changes. Some embodiments may further comprise the step of generating (350) a signal that a button has been pressed if it is detected that said voltage at said monitoring node has changed.

Some embodiments of the method may comprise any of the previously described embodiments of the method wherein the method may comprise the steps of: connecting the series of L resistors to a first reference voltage source whereby the electronic linear keypad circuit is such that there is at least one resistor between the first reference voltage source and any of the switches of the set of N switches, driving the voltage at the common third node of the electronic linear keypad circuit to a second reference voltage that is different from the first reference voltage, and monitoring the voltage at at least one of the first end node, the last end node, or an intermediate node of the series of L resistors to detect if said voltage at said at least one of the first end node, the last end node, or an intermediate node of the series of L resistors is different from said first reference voltage.

Some embodiments of the method may comprise any of the previously described embodiments of the method, whereby the series of L resistors is connected to the first reference voltage source such that there is at least one resistor between the first reference voltage source and any of the switches of the set of N switches.

Some embodiments of the method may comprise any of the previously described embodiments of the method further comprising the step of: generating a signal that button has been pressed if it is detected that said voltage at said at least one of the first end node, the last end node, or an intermediate node of the series of L resistors is different from said first reference voltage.

In another aspect of the invention a method is provided to determine, if a button of a linear keypad is being pressed, which button is being pressed. Some embodiments of the method may be used with various embodiments of the linear keypad described elsewhere in this description. Some embodiments of the method may comprise any of the embodiments of any of the methods to detect whether a button of a linear keypad is being pressed described elsewhere in this description. Particular embodiments of the method are illustrated in FIG. 4.

In some embodiments the linear keypad may comprise an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit.

Some embodiments of the method may comprise any of the previously described embodiments of the method whereby the linear keypad may further comprise a set of buttons whereby each button comprises or is connected to a switch of the set of N switches and whereby if a button of the set of buttons is being pressed a switch of the set of N switches that is comprised in or is connected to the button is closed.

Some embodiments of the method (400) may comprise any of the previously described embodiments of the method and may comprise the steps of: applying (410) a first reference voltage to the first end node of the series of L resistors, applying (420) a second reference voltage that is different from the first reference voltage to the second end node of the series of L resistors, measuring (430) the voltage at the common third node, deducing (440) from the measured voltage which switch of the set of N switches is closed.

Some embodiments of the method may comprise any of the previously described embodiments of the method, wherein the step of deducing from the measured voltage which switch of the set of N switches is closed may comprise calculating the position of a node of the series of L resistors that is connected to the closed switch as a function of the measured voltage. In some embodiments the step of deducing from the measured voltage which switch of the set of N switches is closed may further comprise calculating the position of a node of the series of L resistors that is connected to the closed switch as a function of the measured voltage, the difference between the first and second reference voltage and the values of the resistances of the resistors of the series of L resistors.

Some embodiments of the method may comprise any of the previously described embodiments of the method, wherein the step of deducing from the measured voltage which switch of the set of N switches is closed may comprise comparing the measured voltage with a set of reference voltages.

In still another aspect of the invention a method is provided to detect whether a button of a linear keypad is being pressed and to determine which button is being pressed. Some embodiments of the method may be used with various embodiments of the linear keypad described elsewhere in this description. Some embodiments of the method may comprise any of the embodiments of any of the methods to detect whether a button of a linear keypad is being pressed described elsewhere in this description and may comprise any of the embodiments of any of the methods to determine which button of a linear keypad is being pressed described elsewhere in this description.

In yet another aspect of the invention a method is provided to calibrate an apparatus comprising a linear keypad for making the apparatus capable of determining, if a button of a linear keypad is being pressed, which button is being pressed. Some embodiments of the method may be used with various apparatus comprising one of the embodiments of the linear keypad described elsewhere in this description. Particular embodiments of the method are illustrated in FIG. 5.

In some embodiments the linear keypad may comprise an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit.

Some embodiments of the method may comprise any of the previously described embodiments of the method whereby the linear keypad may further comprise a set of buttons whereby each button comprises or is connected to a switch of the set of N switches and whereby if a button of the set of buttons is being pressed a switch of the set of N switches that is comprised in or is connected to the button is closed.

Some embodiments of the method (500) may comprise any of the previously described embodiments of the method and may comprise the steps of: applying (510) a first reference voltage to the first end node of the series of L resistors, applying (520) a second reference voltage that is different from the first reference voltage to the second end node of the series of L resistors, letting (530) one or more of the switches of the set of N switches be closed one after the other, measuring (540) for each of the one or more closed switches the voltage at the common third node, storing (550) for each of the one or more closed switches the corresponding measured voltage, and associating (560) each stored voltage with the corresponding switch that was closed when the stored voltage was measured.

Some embodiments of the method may comprise any of the previously described embodiments of the method and may further comprise the step of detecting whether a switch is closed prior to measuring the voltage at the common third node.

Some embodiments of the method may comprise any of the previously described embodiments of the method wherein the one or more of the switches of the set of N switches may be closed one after the other in a particular order. In some embodiments this particular order may be predetermined and this predetermined order may be known, implicitly or explicitly, by the apparatus. In some embodiments this particular order may be determined by the apparatus and the method may further comprise the step of the apparatus indicating the order. For example, in some embodiments the apparatus may indicate, e.g. by a message on a display of the apparatus, which button should be pressed by an operator of the apparatus.

In some embodiments the one or more of the switches of the set of N switches may be closed automatically one after the other. For example, in some embodiments the one or more of the switches of the set of N switches may be closed automatically one after the other by a robot pressing one after the other the buttons corresponding to these one or more of the switches of the set of N switches to be closed.

In yet another aspect of the invention an electronic apparatus is provided.

In some embodiments the apparatus may comprise a linear keypad and may comprise any of the electronic keypad circuits and any of the digital electronic components described elsewhere in this description.

In some embodiments the apparatus may be adapted to perform any of the previously described methods. In particular, in some embodiments the apparatus may be adapted to perform any of the embodiments of a method to detect whether a button of the linear keypad is being pressed. In some embodiments the apparatus may be adapted to perform any of the embodiments of a method to determine which button of the linear keypad is being pressed. In some embodiments the apparatus may be adapted to perform any of the embodiments of a method to detect whether a button of the linear keypad is being pressed. In some embodiments the apparatus may be adapted to perform any of the embodiments of a method to calibrate the apparatus for making the apparatus capable of determining, if a button of the linear keypad is being pressed, which button is being pressed.

BRIEF DESCRIPTION OF THE DRAWINGS

The foregoing and other features and advantages of the invention will be apparent from the following, more particular description of embodiments of the invention, as illustrated in the accompanying drawings.

DETAILED DESCRIPTION

Some implementations of the present invention are discussed below.

While specific implementations are discussed, it should be understood that this is done for illustration purposes only. A person skilled in the relevant art will recognize that other components and configurations may be used without departing from the spirit and scope of the invention.

Figure 1:
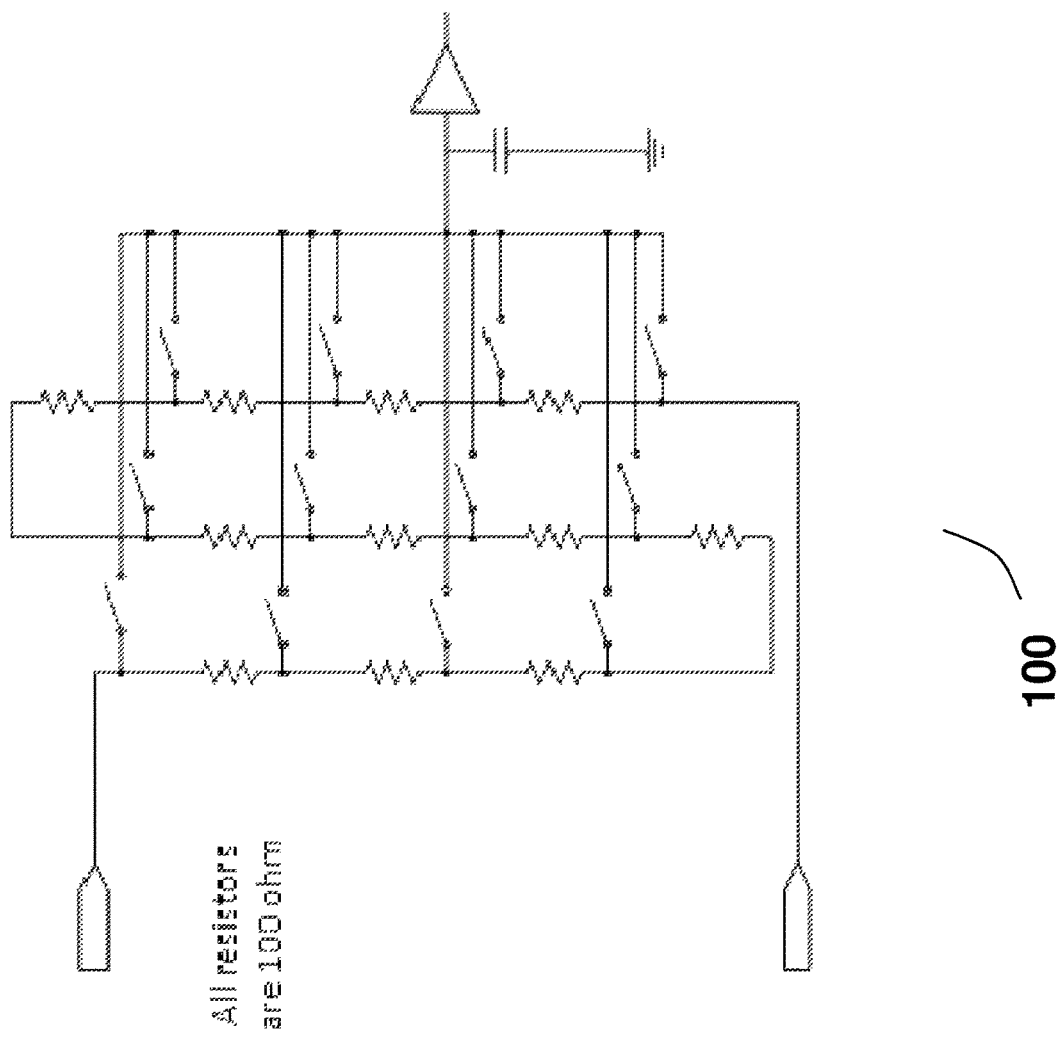
FIG. 1 schematically illustrates an exemplary electronic circuit according to an aspect of the invention.

FIG. 1 schematically illustrates an exemplary electronic circuit (100) for providing a keypad.

In some embodiments the keypad provided by the electronic circuit (100) may be comprised in an electronic apparatus such as any of the apparatus described in more details elsewhere in this description. More in particular a keypad provided by the electronic circuit (100) may be comprised in any of the electronic apparatus described in connection to FIG. 2.

Figure 2:
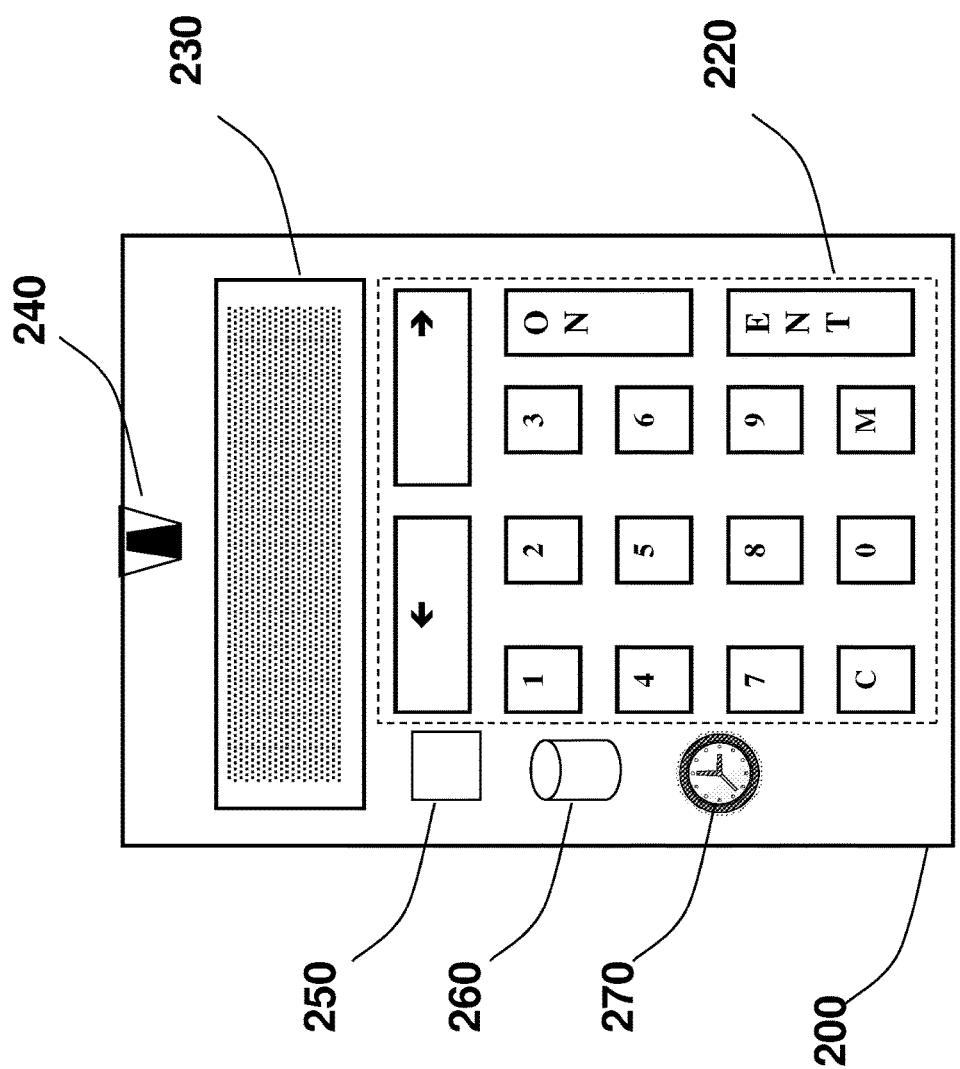
FIG. 2 schematically illustrates an exemplary apparatus according to an aspect of the invention.
Figure 3:
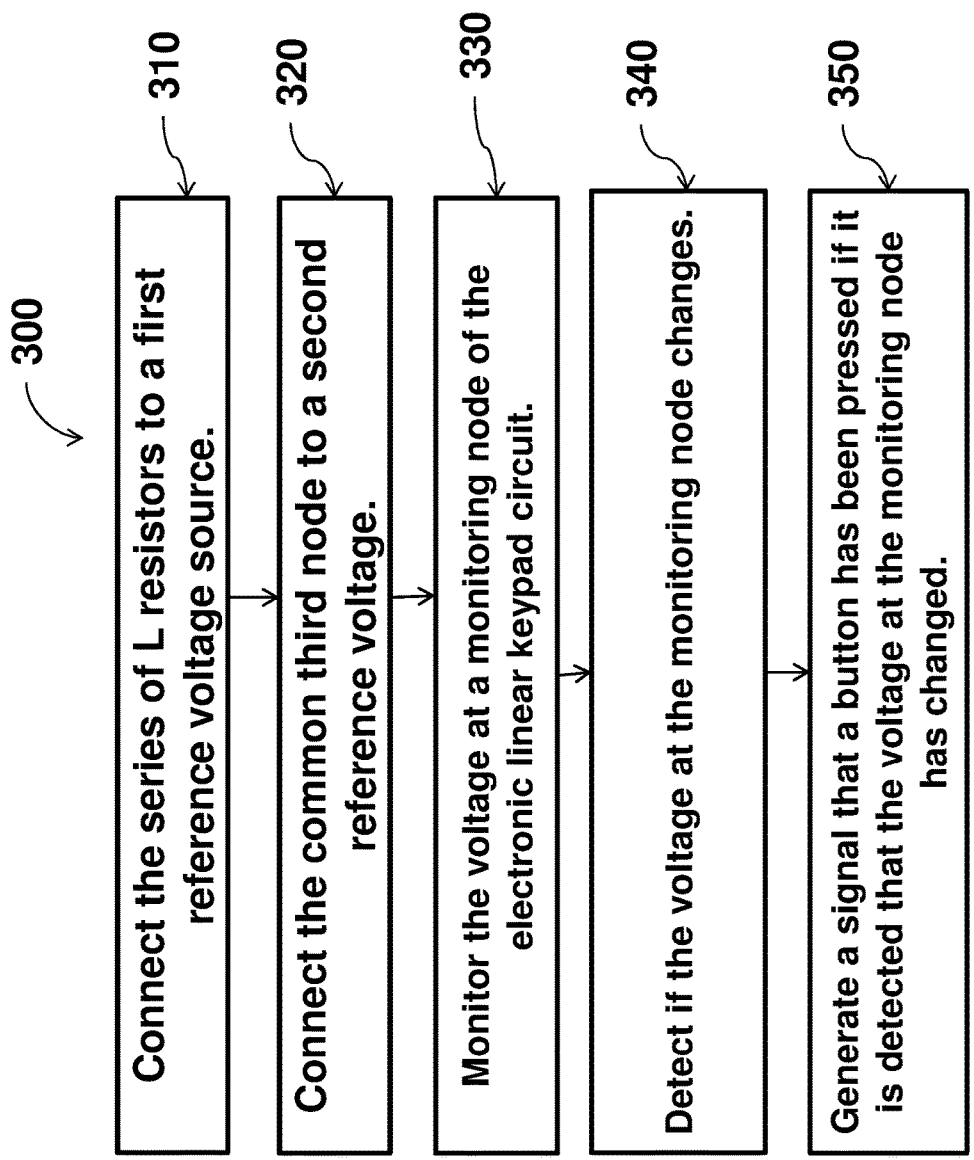
FIG. 3 schematically illustrates an exemplary method for detecting whether a button of a linear keypad is being pressed according to an aspect of the invention.
Figure 4:
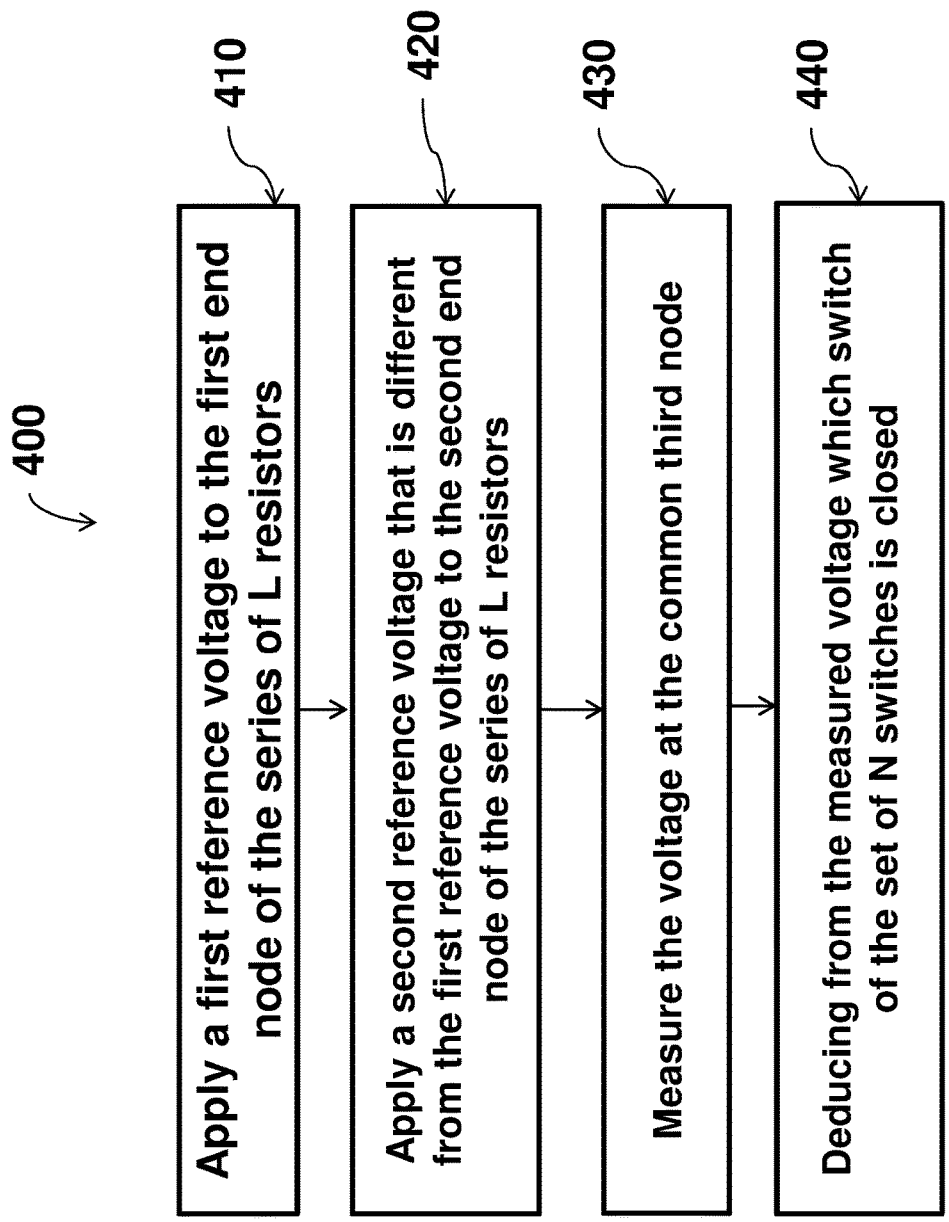
FIG. 4 schematically illustrates an exemplary method for detecting which button of a linear keypad is being pressed according to an aspect of the invention.
Figure 5:
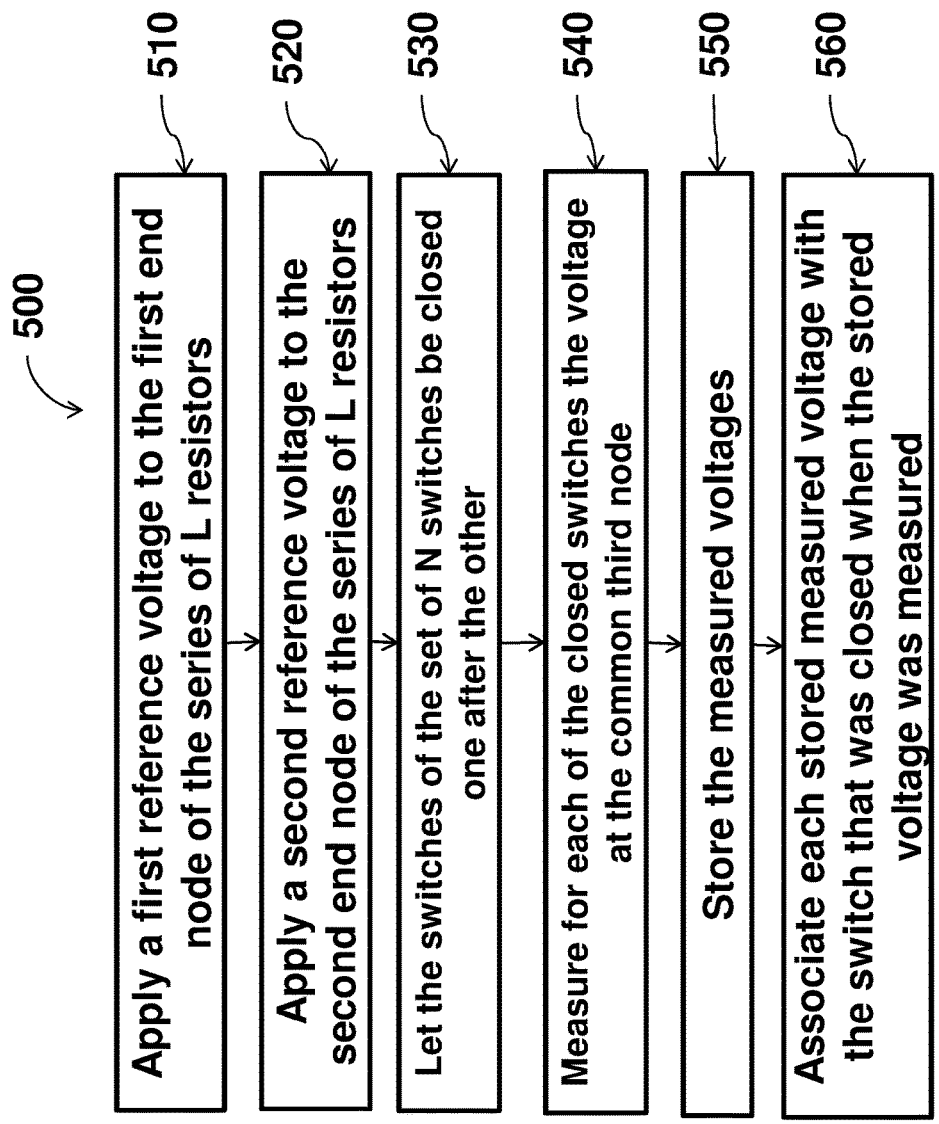
FIG. 5 schematically illustrates an exemplary method for calibrating an apparatus comprising a linear keypad according to an aspect of the invention.
Figure 6:
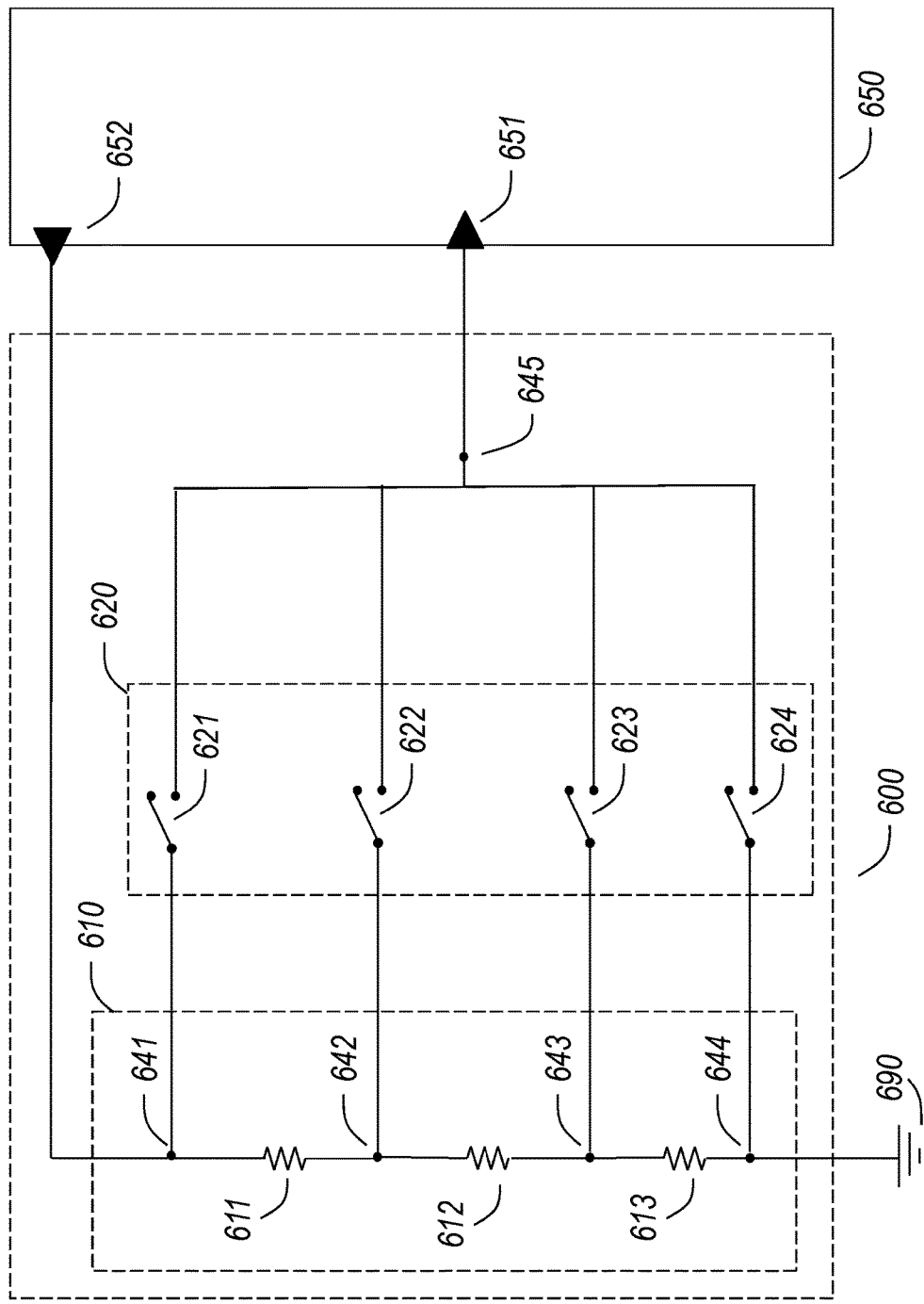
FIG. 6 schematically illustrates another exemplary electronic circuit according to an aspect of the invention.

FIG. 2 schematically illustrates an exemplary electronic apparatus (200) of the invention according to an aspect of the invention.

In some embodiments the apparatus (200) may comprise a strong authentication apparatus. In some embodiments the apparatus may for example comprise a dedicated electronic hardware device the primary or only function of which is to provide authentication services for a legitimate user of the device.

The apparatus (200) may comprise a human user input interface (220), a human user output interface (230), a data processor (250), a memory component (260), and a component (270) for providing the value of a dynamic variable.

Processor (250) and Memory (260).

The apparatus may comprise a digital data processing component (250) that may be adapted to execute a set of data processing instructions, e.g., to implement one or more of the functions of the apparatus. In some embodiments the data processing component (250) may comprise for example one or more microprocessors, microcontrollers, Digital Signal Processor (DSP) chips, Field Programmable Gate Arrays (FPGA), etc. In some embodiments the digital data processing component may comprise any of the IC components described elsewhere in this description.

The apparatus may comprise a memory component (260). The memory component (260) may be connected to the digital data processing component (250). In some embodiments the memory component may comprise a program memory component that is adapted to store software or firmware to be executed by the data processing component. In some embodiments, the functionality that the apparatus supports may be defined by the software or firmware stored in its memory.

In some embodiments the memory component (260) may comprise a data memory component that is adapted to permanently or temporarily store data. In some embodiments the data memory component may be adapted to securely store secret data such as cryptographic keys.

In some embodiments the memory component may be adapted to store reference voltages to determine which button of a keypad is being pressed, as explained in more detail elsewhere in this description.

The memory component may for example comprise RAM (Random Access Memory) memory, ROM (Read-Only Memory) memory, EPROM (Erasable Programmable Read-Only Memory) memory, one-time programmable memory, flash memory, solid-state memory, a hard-disk, etc. In some embodiments the memory (260) may partially or entirely be comprised in the same component as the data processing component (250)

User Interface (220, 230)

In some embodiments the apparatus may comprise a user interface (220, 230) to interact with a user, e.g., to exchange data, information and/or commands with a user. The user interface (220, 230) may be connected to the digital data processing component (250).

In some embodiments the apparatus' user interface may comprise a user output interface (230) for presenting information and/or data to a user of the apparatus. In some embodiments the user output interface may comprise for example a display (230) or an audio output interface.

In some embodiments the apparatus' user interface may comprise a user input interface (220) for receiving inputs from a user such as for example input data (like a challenge or transaction data) or instructions (like a confirmation, authorization or cancellation) or a passcode. In some embodiments the user input interface may comprise for example a keyboard (220).

In some embodiments the user input interface (220) may comprise a linear keypad as described in more details elsewhere in this description. More in particular the input user interface (220) may comprise any of the electronic circuits providing a keypad that are described in connection to FIG. 1.

Credential Generation

In some embodiments the data processing component (250) may be adapted to perform cryptographic calculations to generate dynamic credentials. In some embodiments the apparatus may be adapted to generate dynamic credentials using cryptographic keys that may be stored permanently or temporarily in the memory component (260) or that the apparatus may derive from data stored permanently or temporarily in the memory component (260). In some embodiments the apparatus may be adapted to generate dynamic credentials using data that is part of an instance stored in the memory component (260). In some embodiments the apparatus may be adapted to use a symmetric cryptographic algorithm to generate the dynamic credentials. In some embodiments this cryptographic algorithm for generating dynamic credentials may be parameterized with one or more symmetric secret cryptographic credential generation keys. In some embodiments the credential generation keys may be shared with a server such as for example a credential verification server or an authentication server.

In some embodiments the apparatus may be adapted to generate dynamic credentials using a dynamic variable that may comprise an internal value provided by the apparatus. For example, in some embodiments the apparatus may comprise a clock (270) and the apparatus may use as an internal value the time value provided by that clock. In some embodiments the apparatus may maintain a counter and the apparatus may be adapted to use the value of that counter as in internal value to generate a dynamic credential for that instance and update the value of that counter (e.g., by incrementing or decrementing) each time the apparatus uses the value of that counter to generate a dynamic credential.

In some embodiments the apparatus may be adapted to generate dynamic credentials using a dynamic variable that may comprise an external value provided to the apparatus. In some embodiments such an external value may comprise a challenge generated by a server or transaction data to be signed. In some embodiments the external value may be manually provided to the apparatus by the user by using the user input interface (220) of the apparatus. For example, the apparatus may capture a challenge or transaction data the user may enter as a string of characters on a keyboard comprised in the apparatus. In some embodiments the external value is provided comprised in a message or command that is received by the apparatus by means of its data input interface.

In some embodiments the apparatus may be adapted to present the generated dynamic credential to the user. For example, in some embodiments the apparatus may display the generated dynamic credential as a string of readable characters on its display. In some embodiments the string may comprise only decimal characters. In other embodiments the string may comprise alphanumerical characters.

Form Factor

In some embodiments the apparatus may comprise a plastic circuit board on which at least some of the electronic components comprised in the apparatus may be arranged. Other electronic components may be galvanically connected to components arranged on the circuit board (e.g., by electrical wires). In some embodiments all electronic components of the apparatus are comprised within a single housing. In some embodiments the housing may be made of plastic or of metal or of a combination of materials. In some embodiments the authentication apparatus may be a monolithic device. In the context of this description this means that the digital data processing, the memory component, the user input interface and the user output interface comprised in the authentication apparatus are all comprised into a single physical device.

Size and Weight

In some embodiments the apparatus has a weight and spatial measures such that the apparatus can be considered to be a portable, pocket-sized, hand-held device. In some embodiments the apparatus has a weight and spatial measures such that the apparatus can be sent to the user through mail at moderate costs. For example, in some embodiments the apparatus may have a thickness of less than 2 cm, a width of less than 10 cm, a length of less than 15 cm, and a weight of less than 200 grams. In other embodiments the apparatus may have a thickness of less than 1.5 cm, a width of less than 7 cm, a length of less than 13 cm, and a weight of less than 110 grams. In some embodiments the length and width of the apparatus may exceed the length and the width respectively of a standard full size credit card by no more than 10 percent. In some embodiments the apparatus may have the length and width of a standard full size credit card. In some embodiments the apparatus may have the length, width and thickness of a standard full size credit card within the margins applicable for standard full size credit cards (e.g., having the dimensions of an ID-1 sized smart card as specified by ISO/IEC 7810).

Power Source

In some embodiments the apparatus comprises an autonomous source of electrical power. In some embodiments the power source may comprise a battery. In some embodiments the battery may be replaceable.

A number of implementations have been described. Nevertheless, it will be understood that various modifications may be made. For example, elements of one or more implementations may be combined, deleted, modified, or supplemented to form further implementations. Accordingly, other implementations are within the scope of the appended claims. In addition, while a particular feature may have been disclosed with respect to only one of several implementations, such feature may be combined with one or more other features of the other implementations as may be desired and advantageous for any given or particular application. While various embodiments have been described above, it should be understood that they have been presented by way of example only, and not limitation. In particular, it is, of course, not possible to describe every conceivable combination of components or methodologies for purposes of describing the claimed subject matter, but one of ordinary skill in the art may recognize that many further combinations and permutations are possible. Thus, the breadth and scope of the teachings herein should not be limited by any of the above described exemplary embodiments but should be defined only in accordance with the following claims and their equivalents.

The invention claimed is:

1. An electronic apparatus comprising an electronic linear keypad circuit for providing a keypad comprising:
    a series of L resistors, and
    a set of N switches;
    whereby
    all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby
    one terminal of each switch of the set of switches is connected to one terminal of one of the resistors of the series of L resistors and a second terminal of each switch of the set of N switches is connected to a common third node of the electronic linear keypad circuit and further comprising a digital electronic component connected to the electronic linear keypad circuit, and
    a set of buttons whereby each button of the set of buttons comprises or is connected to a switch of the set of N switches and whereby if a button of the set of buttons is being pressed a corresponding switch of the set of N switches that is comprised in or is connected to the button is closed.

2. The electronic apparatus of claim 1 adapted to support a wait-for-button-press state to detect whether a button of the set of buttons is pressed.

3. The electronic apparatus of claim 2, wherein, while the apparatus is in the wait-for-button-press state:
    the series of L resistors is connected to a first reference voltage;
    the common third node of the electronic linear keypad circuit is connected to a second reference voltage that is different from the first reference voltage;
    a voltage change monitoring pin comprised in the digital electronic component is connected to a monitoring node of the electronic linear keypad circuit, the monitoring node comprising one of the first end node, the second end node, or an intermediate node of the series of L resistors or the common third node of the electronic linear keypad circuit;
    the voltage change monitoring pin is configured as an input pin; and
    wherein the digital electronic component is adapted:
        to monitor the voltage at the monitoring node; and
        to detect whether said voltage at said monitoring node changes or is different than an expected voltage when no button is pressed.

4. The electronic apparatus of claim 3 wherein the voltage change monitoring pin is configured as a digital input pin and the digital electronic component is configured, during the wait-for-button-press state, to be triggered by a rising or falling edge of a voltage at the voltage change monitoring pin.

5. The electronic apparatus of claim 3 wherein the voltage change monitoring pin is configured as an analog-to-digital converter pin and wherein the digital electronic component is configured, during the wait-for-button-press state, to poll a measurement value of a voltage at the voltage change monitoring pin.

6. The electronic apparatus of claim 3 wherein the monitoring node comprises the common third node of the electronic linear keypad circuit and wherein, while the apparatus is in the wait-for-button-press state, the voltage change monitoring pin is connected through a pull-up or pull-down resistor to the second reference voltage.

7. The electronic apparatus of claim 6 wherein the pull-up or pull-down resistor is comprised in the digital electronic component.

8. The electronic apparatus of claim 3 wherein the monitoring node comprises one of the first end node, the last end node, or an intermediate node of the series of L resistors; and wherein the digital electronic component comprises a second reference voltage output pin which is connected to the common third node and which, while the apparatus is in the wait-for-button-press state, is configured to be an output pin driving the common third node to the second reference voltage.

9. The electronic apparatus of claim 8 wherein the monitoring node comprises one of the first end node or the second end node of the series of L resistors.

10. The electronic apparatus of claim 9 wherein the digital electronic component comprises a first reference voltage output pin which is connected to the other of the first end node or the second end node of the series of L resistors and which, while the apparatus is in the wait-for-button-press state, is configured to be an output pin driving said other of the first end node or the second end node of the series of L resistors to the first reference voltage.

11. The electronic apparatus of claim 9 wherein the other of the first end node or the second end node of the series of L resistors is connected to a fixed voltage source which provides the first reference voltage.

12. The electronic apparatus of claim 2 further adapted to support a closed-switch-determination state to determine, after it has been detected that a button of the set of buttons is pressed, which button of the set of buttons is pressed.

13. The electronic apparatus of claim 12, wherein, while the apparatus is in the closed-switch-determination state:
one of the first end node or the second end node of the series of L resistors is connected to a third reference voltage;
the other of the first end node or the second end node of the series of L resistors is connected to a fourth reference voltage that is different from the third reference voltage;
an intermediate voltage measuring pin comprised in the digital electronic component is connected to the common third node of the electronic linear keypad circuit;
the intermediate voltage measuring pin is configured as an input pin capable of measuring the voltage at the intermediate voltage measuring pin; and
wherein the digital electronic component is adapted:
to measure a voltage at the intermediate voltage measuring pin; and
to determine from said measured voltage which button is being pressed.

14. The electronic apparatus of claim 13 wherein the intermediate voltage measuring pin is configured as an analog-to-digital converter pin.

15. The electronic apparatus of claim 1:
wherein the digital electronic component comprises:
a first pin that is connected to the common third node;
a second pin that is connected to the first end node of the series of L resistors; and
a third pin that is connected to the second end node of the series of L resistors; and
wherein the apparatus supports a wait-for-button-press state to detect whether a button of the set of buttons is pressed, and a closed-switch-determination state to determine, after it has been detected that a button of the set of buttons is pressed, which button of the set of buttons is pressed; and
wherein, while the apparatus is in the closed-switch-determination state, the digital electronic component is adapted:
to configure the second pin as an output pin driving the first end node of the series of L resistors to a third reference voltage;
to configure the third pin as an output pin driving the second end node of the series of L resistors to fourth reference voltage that is different from the third reference voltage;
to configure the first pin as an input pin capable of measuring the voltage at the common third node;
to measure a voltage at the common third node; and
to determine from said measured voltage which button is being pressed; and
wherein, while the apparatus is in the wait-for-button-press state, the digital electronic component is adapted:
to configure the first pin, the second pin or the third pin as a voltage monitoring pin which is configured as an input pin;
to monitor the voltage at the voltage monitoring pin;
to detect whether said voltage at said monitoring voltage pin changes or is different than an expected voltage when no button is pressed; and
to conclude, when it is detected that said voltage at said monitoring voltage pin has changed or is different than an expected voltage when no button is pressed, that a button is pressed.

16. The electronic apparatus of claim 15 wherein, while the apparatus is in the wait-for-button-press state, the digital electronic component is adapted to configure one of the second pin or the third pin as the voltage monitoring pin, to configure the other of the second or the third pin as an output pin driving the node that it is connected to a first reference voltage, and to configure the first pin as an output pin driving the common third node to a second reference voltage that is different from the first reference voltage.

17. The electronic apparatus of claim 15 wherein, while the apparatus is in the wait-for-button-press state, the digital electronic component is adapted to configure at least one of the second pin or the third pin as an output pin driving the nodes of the series of L resistors to a first reference voltage and to configure the first pin as the voltage monitoring pin wherein the first pin is further configured as an input pin connected through a pullup or pulldown resistor to a second reference voltage that is different from the first reference voltage.

18. The electronic apparatus of claim 13 wherein the third reference voltage is the same as the first reference voltage and the fourth reference voltage is the same as the second reference voltage, or wherein the third reference voltage is the same as the second reference voltage and the fourth reference voltage is the same as the first reference voltage.

19. The electronic apparatus of claim 1:
wherein the digital electronic component comprises:
a first pin that is connected to the common third node;
a second pin that is connected to the first end node of the series of L resistors; and
wherein the second end node of the series of L resistors is connected to a fixed second reference voltage; and
wherein the apparatus supports a wait-for-button-press state to detect whether a button of the set of buttons is pressed, and a closed-switch-determination state to determine, after it has been detected that a button of the set of buttons is pressed, which button of the set of buttons is pressed; and
wherein, while the apparatus is in the closed-switch-determination state, the digital electronic component is adapted:

to configure the second pin as an output pin driving the first end node of the series of L resistors to a first reference voltage that is different from the second reference voltage; and to configure the first pin as an input pin capable of measuring the voltage at the intermediate voltage measuring pin;

to measure a voltage at the intermediate voltage measuring pin; and to determine from said measured voltage which button is being pressed; and wherein, while the apparatus is in the wait-for-button-press state, the digital electronic component is adapted:

to configure either the first pin or the second pin as a voltage monitoring pin which is configured as an input pin;

to monitor the voltage at the voltage monitoring pin;

to detect whether said voltage at said monitoring voltage pin changes or is different than an expected voltage when no button is pressed; and to conclude, when it is detected that said voltage at said monitoring voltage pin has changed or is different than an expected voltage when no button is pressed, that a button is pressed.

20. The electronic apparatus of claim 19 wherein, while the apparatus is in the wait-for-button-press state, the digital electronic component is adapted to configure the second pin as the voltage monitoring pin and the first pin as an output pin driving the common third node to the first reference voltage.

21. The electronic apparatus of claim 19 wherein, while the apparatus is in the wait-for-button-press state, the digital electronic component is adapted to configure the first pin as the voltage monitoring pin wherein the first pin is further configured as an input pin connected through a pullup or pulldown resistor to the first reference voltage.

22. The electronic apparatus of claim 13 wherein the step of determining from the measured voltage which button is being pressed comprises calculating the position of a node of the series of L resistors that is connected to a closed switch that corresponds to the button that is being pressed, as a function of the measured voltage.

23. The electronic apparatus of claim 13 wherein the step of determining from the measured voltage which button is being pressed further comprises calculating the position of a node of the series of L resistors that is connected to a closed switch that corresponds to the button that is being pressed, as a function of the measured voltage, the difference between the voltages at the first and second end nodes of the series of L resistors and the values of the resistances of the resistors of the series of L resistors.

24. The electronic apparatus of claim 13 wherein the step of determining from the measured voltage which button is being pressed comprises comparing the measured voltage with a set of reference voltages.

25. The electronic apparatus of claim 24 wherein the step of determining from the measured voltage which button is being pressed further comprises the step of determining the button that is being pressed as being a button that is associated with one of the reference voltages.

26. The electronic apparatus of claim 24 wherein the digital electronic component is further adapted to, during a calibration phase, measure for each switch of the set of N switches a calibration voltage and store the measured calibration voltages for use in the closed-switch-determination state in said step of determining which button is being pressed.

27. The electronic apparatus of claim 26 wherein each stored calibration voltage is associated with a button corresponding with a switch that was closed when the stored calibration voltage was measured.

28. The electronic apparatus of claim 2 further adapted to support a wait-for-button-release state to detect whether a closed button is released again.

29. A method for detecting whether a button of a linear keypad is being pressed wherein the linear keypad comprises an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit; and wherein the method comprises the steps of:

connecting the series of L resistors to a first reference voltage source, connecting the common third node of the electronic linear keypad circuit to a second reference voltage that is different from the first reference voltage, and monitoring the voltage at a monitoring node of the electronic linear keypad circuit, the monitoring node comprising at least one of the first end node, the last end node, or an intermediate node of the series of L resistors or the common third node of the electronic linear keypad circuit, to detect if said voltage at said monitoring node changes and wherein the electronic linear keypad circuit further comprises a set of buttons whereby each button of the set of buttons comprises or is connected to a switch of the set of N switches and whereby if a button of the set of buttons is being pressed a corresponding switch of the set of N switches that is comprised in or is connected to the button is closed.

30. The method of claim 29 further comprising the step of: generating a signal that a button of the set of buttons has been pressed if it is detected that said voltage at said monitoring node has changed.

31. The method of claim 29 whereby the series of L resistors is connected to the first reference voltage source such that there is at least one resistor between the first reference voltage source and any of the switches of the set of N switches.

32. A method for determining, if a button of a linear keypad is being pressed, which button is being pressed, wherein the linear keypad comprises an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit; and wherein the method comprises the steps of:

applying a first reference voltage to the first end node of the series of L resistors, applying a second reference voltage that is different from the first reference voltage to the second end node of the series of L resistors, measuring the voltage at the common third node, deducing from the measured voltage which switch of the set of N switches is closed and wherein the electronic linear keypad circuit further comprises a set of buttons whereby each button of the set of buttons comprises or is connected to a switch of the set of N switches and whereby if a button of the set of buttons is being pressed a corresponding switch of the set of N switches that is comprised in or is connected to the button is closed.

33. The method of claim 32 wherein the step of deducing from the measured voltage which switch of the set of N switches is closed comprises calculating the position of a node of the series of L resistors that is connected to the closed switch as a function of the measured voltage.

34. The method of claim 33 wherein the step of deducing from the measured voltage which switch of the set of N switches is closed further comprises calculating the position of a node of the series of L resistors that is connected to the closed switch as a function of the measured voltage, the difference between the first and second reference voltage and the values of the resistances of the resistors of the series of L resistors.

35. The method of claim 32 wherein the step of deducing from the measured voltage which switch of the set of N switches is closed comprises comparing the measured voltage with a set of reference voltages.

36. The method of claim 35 further comprising the step of determining the switch that is closed as being a switch that is associated with one of the reference voltages.

37. A method for calibrating an apparatus comprising a linear keypad to make the apparatus capable of determining, if a button of a linear keypad is being pressed, which button is being pressed wherein the linear keypad comprises an electronic linear keypad circuit comprising a series of L resistors and a set of N switches, whereby all the resistors of the series of L resistors are connected in series whereby each resistor of the series of L resistors has two terminals and each terminal of each resistor is connected to an intermediate node that is further connected to a terminal of exactly one other resistor of the series of L resistors, except for a first resistor of which a first terminal is connected to a first end node of the series of L resistors that is not connected to any other resistor of the series of L resistors and of which a second terminal is connected to an intermediate node that is further connected to a terminal of exactly one other resistor of the series of L resistors, and except for a last resistor of which a first terminal is connected to an intermediate node that is further connected to a terminal of exactly one other resistor of the series of L resistors and of which a second terminal is connected to a second end node of the series of L resistors that is not connected to any other resistor of the series of L resistors; and whereby one terminal of each switch of the set of switches is connected to one terminal of one of the resistors of the series of L resistors and a second terminal of each switch of the set of N switches is connected to a common third node of the electronic linear keypad circuit; and wherein the method comprises the steps of:

applying a first reference voltage to the first end node of the series of L resistors, applying a second reference voltage that is different from the first reference voltage to the second end node of the series of L resistors, letting one or more of the switches of the set of N switches be closed one after the other, measuring for each of the one or more closed switches the voltage at the common third node, storing for each of the one or more closed switches the measured voltage, and associating for each of the one or more closed switches the measured voltage with the switch that is closed when measuring the voltage and wherein the electronic linear keypad circuit further comprises a set of buttons whereby each button of the set of buttons comprises or is connected to a switch of the set of N switches and whereby if a button of the set of buttons is being pressed a corresponding switch of the set of N switches that is comprised in or is connected to the button is closed.

38. The method of claim 37 further comprising the step of detecting whether a switch is closed prior to measuring the voltage at the common third node.

39. The method of claim 37 wherein the one or more of the switches of the set of N switches are closed one after the other in a particular order.

40. The method of claim 39 wherein said particular order is predetermined and is known, implicitly or explicitly, by the apparatus.

41. The method of claim 39 wherein said particular order is determined by the apparatus and wherein the method further comprises the step of the apparatus indicating the order.

42. The method of claim 37 further comprising closing the one or more of the switches of the set of N switches automatically one after the other by a robot pressing one after the other buttons that correspond to these one or more of the switches of the set of N switches to be closed.

* * * * *